(12) United States Patent
Liang et al.

(10) Patent No.: US 9,640,413 B2
(45) Date of Patent: May 2, 2017

(54) ETCHING-BEFORE-PACKAGING HORIZONTAL CHIP 3D SYSTEM-LEVEL METAL CIRCUIT BOARD STRUCTURE AND TECHNIQUE THEREOF

(71) Applicant: Jiangsu Changjiang Electronics Technology Co., Ltd, Jiangsu (CN)

(72) Inventors: Steve Xin Liang, Jiangsu (CN); Chih-Chung Liang, Jiangsu (CN); Yu-Bin Lin, Jiangsu (CN); Yaqin Wang, Jiangsu (CN); Youhai Zhang, Jiangsu (CN)

(73) Assignee: Jiangsu Changjiang Electronics Technology Co., Ltd, Jiangsu (CN)

( * ) Notice: Subject to any disclaimer, the term of this patent is extended or adjusted under 35 U.S.C. 154(b) by 0 days.

(21) Appl. No.: 14/901,878

(22) PCT Filed: Dec. 2, 2013

(86) PCT No.: PCT/CN2013/088317
§ 371 (c)(1),
(2) Date: Dec. 29, 2015

(87) PCT Pub. No.: WO2015/018144
PCT Pub. Date: Feb. 12, 2015

(65) Prior Publication Data
US 2016/0372338 A1    Dec. 22, 2016

(30) Foreign Application Priority Data
Aug. 6, 2013    (CN) .......................... 2013 1 0339322

(51) Int. Cl.
*H01L 21/00* (2006.01)
*H01L 21/48* (2006.01)
(Continued)

(52) U.S. Cl.
CPC .......... *H01L 21/4832* (2013.01); *H01L 21/48* (2013.01); *H01L 21/486* (2013.01);
(Continued)

(58) Field of Classification Search
CPC ........... H01L 23/49575; H01L 21/4825; H01L 21/4853
(Continued)

(56) References Cited

U.S. PATENT DOCUMENTS 6,235,552 B1 *   5/2001   Kwon .................. H01L 23/3114
                                                                257/E21.508
6,270,263 B1 *   8/2001   Iwase ................... G02B 6/4292
                                                                385/14
(Continued)

FOREIGN PATENT DOCUMENTS

CN    2636411 Y    8/2004
CN    2664198 Y    12/2004
(Continued)

OTHER PUBLICATIONS

State Intellectual Property Office, CN Office Action for Application No. CN 201310339322.4, mailed Jul. 28, 2015.
(Continued)

*Primary Examiner* — Caleb Henry
(74) *Attorney, Agent, or Firm* — Honigman Miller Schwartz and Cohn LLP; Matthew H. Szalach; Jonathan P. O'Brien

(57) ABSTRACT

Provided is an etching-before-packaging horizontal chip three-dimensional system level metal circuit board structure comprising a metal substrate frame; the metal substrate frame is provided with base islands and pins therein; the front faces of the base islands are provided with chips; the front faces of the chips are connected to the front faces of the pins via metal wires; conductive posts are disposed on the
(Continued)

front faces or back faces of the pins; the peripheral areas of the base islands, the areas between the base islands and the pins, the areas between the pins, the areas above the base islands and the pins, the areas below the base islands and the pins, and the exteriors of the chips, the metal wires and the conductive posts are all encapsulated with molding compound.

19 Claims, 23 Drawing Sheets

(51) Int. Cl.
*H01L 23/495* (2006.01)
*H01L 23/498* (2006.01)
*H01L 23/00* (2006.01)
*H01L 21/56* (2006.01)
*H01L 23/31* (2006.01)

(52) U.S. Cl.
CPC ...... *H01L 21/4825* (2013.01); *H01L 21/4853* (2013.01); *H01L 21/4857* (2013.01); *H01L 21/4871* (2013.01); *H01L 21/4885* (2013.01); *H01L 21/4889* (2013.01); *H01L 21/561* (2013.01); *H01L 23/49513* (2013.01); *H01L 23/49517* (2013.01); *H01L 23/49531* (2013.01); *H01L 23/49548* (2013.01); *H01L 23/49565* (2013.01); *H01L 23/49575* (2013.01); *H01L 23/49811* (2013.01); *H01L 23/49822* (2013.01); *H01L 24/16* (2013.01); *H01L 24/48* (2013.01); *H01L 24/73* (2013.01); *H01L 21/568* (2013.01); *H01L 23/3107* (2013.01); *H01L 2224/16225* (2013.01); *H01L 2224/32145* (2013.01); *H01L 2224/32225* (2013.01); *H01L 2224/45147* (2013.01); *H01L 2224/48091* (2013.01); *H01L 2224/48137* (2013.01); *H01L 2224/48245* (2013.01); *H01L 2224/73204* (2013.01); *H01L 2224/73265* (2013.01); *H01L 2224/83192* (2013.01); *H01L 2224/92247* (2013.01); *H01L 2924/181* (2013.01); *H01L 2924/19107* (2013.01); *H01L 2924/351* (2013.01)

(58) Field of Classification Search
USPC ........................................................ 257/676
See application file for complete search history.

(56) References Cited

U.S. PATENT DOCUMENTS

| | | | | |
|---|---|---|---|---|
| 6,306,682 B1* | 10/2001 | Huang | .................... | H01L 21/56 257/E21.502 |
| 6,498,099 B1* | 12/2002 | McLellan | ........... | H01L 21/4832 257/E23.043 |
| 6,559,540 B2* | 5/2003 | Kawashima | ........ | H01L 23/3171 257/737 |
| 6,686,652 B1* | 2/2004 | Bayan | ................. | H01L 21/4842 257/678 |
| 6,956,283 B1* | 10/2005 | Peterson | ............... | B81B 7/0025 257/680 |
| 6,987,031 B2* | 1/2006 | Eng | ..................... | H01L 21/4857 257/E21.705 |
| 7,145,225 B2* | 12/2006 | Lee | ..................... | H01L 23/3677 257/684 |
| 7,816,187 B2* | 10/2010 | Huang | ................ | H01L 21/4832 257/690 |
| 8,063,470 B1* | 11/2011 | Sirinorakul | ......... | H01L 21/4832 257/666 |
| 8,735,224 B2* | 5/2014 | Do | ...................... | H01L 21/4832 257/676 |
| 9,281,258 B1* | 3/2016 | Fon | ...................... | H01L 23/3121 |
| 2004/0195664 A1* | 10/2004 | Chiu | .................. | G06K 9/00053 257/676 |
| 2004/0259289 A1* | 12/2004 | Hubbard | ............. | H01L 23/4985 438/108 |
| 2005/0200007 A1* | 9/2005 | Liu | ......................... | H01L 23/50 257/724 |
| 2006/0079027 A1* | 4/2006 | Yamada | ............. | H01L 21/4857 438/121 |
| 2007/0126112 A1* | 6/2007 | Cho | ....................... | H05K 1/056 257/700 |
| 2007/0141756 A1* | 6/2007 | Iitani | ................... | H01L 21/4821 438/123 |
| 2008/0289866 A1* | 11/2008 | Yuri | .................. | H01L 23/49822 174/260 |
| 2009/0004784 A1* | 1/2009 | Huang | ................ | H01L 21/4832 438/124 |
| 2010/0052146 A1* | 3/2010 | Jiang | ..................... | H01L 21/561 257/690 |
| 2010/0258921 A1* | 10/2010 | Chang Chien | ...... | H01L 21/4832 257/676 |
| 2011/0057298 A1* | 3/2011 | Ramos | .................... | H01L 24/36 257/667 |
| 2011/0115069 A1* | 5/2011 | Teh | ....................... | H01L 21/486 257/693 |
| 2011/0163433 A1* | 7/2011 | Toda | .................. | H01L 21/4828 257/676 |
| 2012/0018867 A1* | 1/2012 | Toda | .................. | H01L 21/4828 257/676 |
| 2012/0038036 A1* | 2/2012 | Chun | .................. | H01L 21/4832 257/677 |
| 2016/0141233 A1* | 5/2016 | Liang | ................ | H01L 23/49575 257/676 |
| 2016/0148861 A1* | 5/2016 | Liang | ................ | H01L 23/49517 257/676 |
| 2016/0163622 A1* | 6/2016 | Liang | .................. | H01L 23/3128 257/676 |

FOREIGN PATENT DOCUMENTS

| | | |
|---|---|---|
| CN | 102456677 A | 5/2012 |
| CN | 102723282 A | 10/2012 |
| CN | 102723284 A | 10/2012 |
| CN | 103413766 A | 11/2013 |
| KR | 20130077033 A | 7/2013 |

OTHER PUBLICATIONS

International Searching Authority, International Search Report for International Application No. PCT/CN2013/088317, mailed May 14, 2014.

* cited by examiner

ETCHING-BEFORE-PACKAGING HORIZONTAL CHIP 3D SYSTEM-LEVEL METAL CIRCUIT BOARD STRUCTURE AND TECHNIQUE THEREOF

This application is the national phase of International Application No. PCT/CN2013/088317, titled "ETCHING-BEFORE-PACKAGING HORIZONTAL CHIP 3D SYSTEM-LEVEL METAL CIRCUIT BOARD STRUCTURE AND TECHNIQUE THEREOF", filed Dec. 2, 2013, which claims priority to Chinese Patent Application No. 201310339322.4 titled "ETCHING-FIRST-PACKAGING-SECOND UPSIDE-UPWARD-INSTALLATION THREE-DEMENSIONAL SYSTEM-IN-PACKAGE METAL CIRCUITWIRING BOARD STRUCTURE AND PROCESS METHOD" and filed with the Chinese State Intellectual Property Office on Aug. 6, 2013, both of which are hereby incorporated by reference in their entireties.

FIELD

The present disclosure relates to an first-etched and later-packaged normal chip three-dimensional system-in-package metal wiring board structure and a method therefor, first-etched and later-packaged wiring which relates to the technical field of semiconductor packaging.

BACKGROUND

Conventional techniques for fabricating a metal lead frame include the following methods.

1) In mechanical punching technology, a metal sheet is punched by a top blade and a bottom blade from top to bottom or from bottom to top longitudinally, so that a die pad for carrying a chip, an inner lead for signal transmission and an outer lead connected to an external PCB (Printed Wiring Board) can be formed in a lead frame in the metal sheet, and afterwards a metallic electroplated coating is coated on specific regions of the inner lead(or) and the die pad, to form a useable lead frame (referring to FIGS. 76 to 78).

2) In chemical etching technology, exposing, developing, windowing and chemical etching are performed on a metal sheet, so that a die pad for carrying a chip, an inner lead for signal transmission and an outer lead connected to an external PCB can be formed in a lead frame in the metal sheet, and afterwards a metallic electroplated coating is coated on specific regions of the inner lead and(or) the die pad, to form a useable lead frame (referring to FIG. 79 to 80).

3) Based on method 1) and method 2), another method further includes pasting a high temperature adhesive film with resistance to 260 degrees Celsius on the back of the lead frame which already includes the die pad for carrying a chip, the inner lead for signal transmission, the outer lead connected to an external PCB and the metallic electroplated coating on specific regions of the inner lead and(or) the die pad, to form a lead frame which can be used in a quad no-lead package and a scale plastic package (referring to FIG. 81).

4) Based on method 1) and method 2), another method further includes prepackaging the lead frame which includes the die pad for carrying a chip, the inner lead for signal transmission, the outer lead connected to an external PCB and metallic electroplated coating on specific regions of the inner lead and the die pad, and filling punched or chemically etched regions in the metal sheet with a thermoset epoxy resin, to form a pre-filled lead frame which can be used in a quad no-lead package and a scale plastic package and a package with copper wire bonding (referring to FIG. 82).

The disadvantages of the conventional technique are described as follows.

1) Lead Frame Formed through Mechanical Punching a. In mechanical punching, a top blade and a bottom blade punch from top to bottom or from bottom to top to form a vertical section, thus any other function or component cannot be embedded into the lead frame, for example, a system object can not be integrated into the metal lead frame.

b. in mechanical punching, an edge of a metal sheet is extruded through a top blade and a bottom blade to form a extended metallic region, and length of the extended metallic region formed through extrusion can only be 80% of thickness of the lead frame at most. In a case that the length is larger than 80% of the thickness of the lead frame, the extended metallic region formed through extrusion is prone to problems such as a warpage, a subfissure, a rupture, an irregular shape and a surface hole, and an ultrathin lead frame is more prone to these problems (referring to FIGS. 85 to 86).

c. In a case that the length of the extended metallic region formed through mechanical punching is smaller than or exactly 80% of the thickness of the lead frame, the extended length is not enough for embedding a related object in the extended metallic region, especially for an ultrathin lead frame (referring to FIGS. 85 and 86).

2) Lead Frame formed through Chemical Etching a. In chemical etching, space for embedding a component can be obtained through partial-etching, and the major disadvantage thereof is the difficulty to control a etching depth and a flatness of an etched plane.

b. After partially-etched regions for embedding components are formed in a metal sheet, a structural strength of the lead frame becomes very small, which will directly influence operation conditions (such as, pick-and-place, transportation, a high temperature, high pressure and thermal shrinkage) required for embedding an object later.

c. The lead frame formed through chemical etching can only present a pattern of an outer lead or an inner lead on the top surface and the back of the lead frame, and cannot present a system-in-package metal lead frame with a multilayer three-dimensional metal wiring.

SUMMARY

In order to overcome the disadvantages above, an first-etched and later-packaged normal chip three-dimensional system-in-package metal wiring board structure and a method therefor are provided, which can improve the functionality and application performance of a conventional metal lead frame limited by that a component can not be embedded in the metal lead frame.

A method for manufacturing a first-etched and later-packaged normal chip three-dimensional system-in-package metal wiring board is provided. The method includes:

step 1, providing a metal substrate;

step 2, pre-plating a surface of the metal substrate with a micro copper layer;

step 3, applying with a photoresist film, wherein a photoresist film which is able to be exposed and developed is pasted on a top surface and a bottom surface of the metal substrate pre-plated with the micro copper layer;

step 4, removing a part of the photoresist film on the bottom surface of the metal substrate, wherein the bottom surface of the metal substrate, which has been pasted with the photoresist film in step 3, is exposed and developed with a pattern using an exposure and development equipment, and the part of the photoresist film in the pattern is removed, so as to expose a region of the bottom surface of the metal substrate to be plated later;

step 5, plating with a metal wiring layer, wherein the region of the bottom surface of the metal substrate from which the part of the photoresist film has been removed in step 4 is plated with the metal wiring layer;

step 6, applying with a photoresist film, wherein the bottom surface of the metal substrate in step 5 is pasted with the photoresist film which can be exposed and developed;

step 7, removing a part of the photoresist film on the bottom surface of the metal substrate, wherein the bottom surface of the metal substrate, which has been pasted with the photoresist film in step 6, is exposed and developed with a pattern using an exposure and development equipment, and the part of the photoresist film in the pattern is removed, so as to expose a region of the bottom surface of the metal substrate to be plated later;

step 8, plating with a high-conductivity metal wiring layer, wherein the region of the bottom surface of the metal substrate from which the part of the photoresist film has been removed in step 7 is plated with the high conductivity metal wiring layer;

step 9, removing the photoresist film, wherein the photoresist film on the surface of the metal substrate is removed;

step 10, molding with an epoxy resin, wherein the molding with the epoxy resin for protection is performed on a surface of the metal wiring layer on the bottom surface of the metal substrate;

step 11, grinding a surface of the epoxy resin, wherein the surface of the epoxy resin is ground after the molding with the epoxy resin has been performed;

step 12, applying with a photoresist film, wherein the top surface and the bottom surface of the metal substrate are applied with the photoresist film which can be exposed and developed after the surface of the epoxy resin has been ground in step 11;

step 13, removing a part of the photoresist film on the top surface of the metal substrate, wherein the top surface of the metal substrate, which has been applied with the photoresist film in step 12, is exposed and developed with a pattern using an exposure and development equipment, and the part of the photoresist film in the pattern is removed, so as to expose a region of the top surface of the metal substrate to be etched later;

step 14, chemical etching, wherein the chemical etching is performed in the region of the top surface of the metal substrate in which exposing and developing have been performed in step 13;

step 15, plating with a metal layer, wherein the top surface of the metal substrate on which the chemical etching has been performed in step 14 is plated with the metal layer, so that a die pad and a lead are formed on the metal substrate;

step 16, applying with a photoresist film, wherein the top surface and the bottom surface of the metal substrate are applied with the photoresist film which can be exposed and developed after the plating with the metal layer has been performed in step 15;

step 17, removing a part of the photoresist film on the top surface of the metal substrate, wherein the top surface of the metal substrate, which has been applied with the photoresist film in step 16, is exposed and developed with a pattern using an exposure and development equipment, and the part of the photoresist film in the pattern is removed, so as to expose a region of the top surface of the metal substrate to be plated later;

step 18, plating with a metal pillar, wherein the region of the top surface of the metal substrate from which the part of the photoresist film has been removed in step 17 is plated with the metal pillar;

step 19, removing the photoresist film, wherein the photoresist film on the surface of the metal substrate is removed;

step 20, coating with an adhesive material, wherein a top surface of the die pad is coated with a conductive or non-conductive adhesive material after the die pad has been formed in step 15;

step 21, bonding dies, wherein a chip is bonded in the conductive or non-conductive adhesive material in step 20;

step 22, bonding a metal wire, wherein the metal wire is bonded between a top surface of the chip and a top surface of the lead;

step 23, encapsulating, wherein the molding with a molding material is performed on the top surface of the metal substrate in step 22;

step 24, grinding a surface of an epoxy resin, wherein the surface of the epoxy resin is ground after the molding with the epoxy resin has been performed in step 23; and step 25, plating with an anti-oxidizing metal layer or coating with an antioxidant, wherein an exposed surface of the metal substrate is plated with the anti-oxidizing metal layer or is coated with the antioxidant after the surface of the epoxy resin has been ground in step 24.

Step 15 is performed between step 4 and step 5.

A first-etched and later-packaged normal chip three-dimensional system-in-package metal wiring board structure includes a metal substrate frame, where a die pad and a lead are provided in the metal substrate frame, a chip is provided on a top surface or a bottom surface of the die pad via a conductive or nonconductive material, the top surface of the chip and the top surface of the lead are connected through a metal wire, a conductive pillar is provided on the top surface or the bottom surface of the lead, and a peripheral region of the die pad, a region between the die pad and the lead, a region between the lead and another lead, an upper region of the die pad and the lead, a lower region of the die pad and the lead, and the chip, the metal wire and the conductive pillar are encapsulated, with a molding material being flush with a top of the conductive pillar, and surfaces of the metal substrate frame, the lead and the conductive pillar exposed from the molding material being plated with an anti-oxidizing layer or being coated with an antioxidant.

A first-etched and later-packaged normal chip three-dimensional system-in-package metal wiring board structure includes a metal substrate frame and a chip, where a lead is provided in the metal substrate frame, the chip is provided on a top surface of the lead or between the lead and another lead via a conductive or nonconductive adhesive material, a top surface of the chip and the top surface of the lead are connected through a metal wire, and a conductive pillar is provided on the top surface or a bottom surface of the lead, a region between the lead and another lead, an upper region of the lead, an lower region of the lead, and a peripheral region of the chip, the metal wire and the conductive pillar are encapsulated, with a molding material being flush with a top of the conductive pillar, and surfaces of the metal substrate frame, the lead and the conductive pillar exposed from the molding material being plated with an anti-oxidizing layer or being coated with an antioxidant (OSP).

A passive device is connected across the lead and another lead via a conductive adhesive material, the passive device is connected across the top surface of the lead and the top surface of another lead, or across the bottom surface of the lead and the bottom surface of another lead.

There are a plurality of rings of the conductive pillars.

A second chip is provided on the top surface of the chip via a conductive or nonconductive adhesive material, and the top surface of the second chip and the lead are connected through a metal wire.

A second conductive pillar is provided on the top surface or the bottom surface of the lead, a second chip is flipped on the second conductive pillar via a conductive material, and the second conductive pillar and the second chip are provided inside the molding material.

A second conductive pillar is provided on the top surface or the bottom surface of the lead, a passive device is provided on the second conductive pillar, and the second conductive pillar and the passive device are provided inside the molding material.

A method for manufacturing a first-etched and later-packaged normal chip three-dimensional system-in-package metal wiring board is provided. The method includes:

step 1, providing a metal substrate;

step 2, pre-plating a surface of the metal substrate with a micro copper layer;

step 3, applying with a photoresist film, wherein a top surface and a bottom surface of the metal substrate which have been pre-plated with the micro copper layer are respectively applied with the photoresist film which can be exposed and developed;

step 4, removing a part of the photoresist film on the top surface of the metal substrate, wherein the top surface of the metal substrate, which has been applied with the photoresist film in step 3, is exposed and developed with a pattern using an exposure and development equipment, and the part of the photoresist film in the pattern is removed, so as to expose a region of the top surface of the metal substrate to be plated later;

step 5, plating with a first metal wiring layer, wherein the region of the top surface of the metal substrate from which the part of the photoresist film has been removed in step 4 is plated with the first metal wiring layer;

step 6, applying with a photoresist film, wherein the top surface of the metal substrate in step 5 is applied with the photoresist film which can be exposed and developed;

step 7, removing a part of the photoresist film on the top surface of the metal substrate, wherein the top surface of the metal substrate, which has been applied with the photoresist film in step 6, is exposed and developed with a pattern using an exposure and development equipment, and the part of the photoresist film in the pattern is removed, so as to expose a region of the top surface of the metal substrate to be plated later;

step 8, plating with a second metal wiring layer, wherein the region of the top surface of the metal substrate from which the part of the photoresist film has been removed in step 7 is plated with the second metal wiring layer, which serves as a conductive pillar to connect the first metal wiring layer to a third metal wiring layer;

step 9, removing the photoresist film, wherein the photoresist film on the surface of the metal substrate is removed;

step 10, applying with a non-conductive adhesive film, wherein the top surface of the metal substrate is applied with a layer of the non-conductive adhesive film;

step 11, grinding a surface of the non-conductive adhesive film, wherein the surface of the non-conductive adhesive film is ground after the applying the non-conductive adhesive film has been performed;

step 12, performing metallization pretreatment on the surface of the non-conductive adhesive film, wherein the metallization pretreatment is performed on the surface of the non-conductive adhesive film;

step 13, applying with a photoresist film, wherein the top surface and the bottom surface of the metal substrate in step 12 are applied with the photoresist film which can be exposed and developed;

step 14, removing a part of the photoresist film on the top surface of the metal substrate, wherein the top surface of the metal substrate, which has been applied with the photoresist film in step 13, is exposed and developed with a pattern using an exposure and development equipment, and the part of the photoresist film in the pattern is removed, so as to expose a region of the top surface of the metal substrate to be etched later;

step 15, etching;

wherein the etching is performed in a region from which the part of the photoresist film has been removed in step 14;

step 16, removing the photoresist film on the top surface of the metal substrate, wherein the photoresist film on the top surface of the metal substrate is removed, so as to expose a metallized region to be plated later;

step 17, plating with a third metal wiring layer, wherein the top surface of the metal substrate in step 16 is plated with the third metal wiring layer;

step 18, applying with a photoresist film, wherein the top surface of the metal substrate in step 17 is applied with the photoresist film which can be exposed and developed;

step 19, removing a part of the photoresist film on the top surface of the metal substrate, wherein the top surface of the metal substrate, which has been applied with the photoresist film in step 18, is exposed and developed with a pattern using an exposure and development equipment, and the part of the photoresist film in the pattern is removed, so as to expose a region of the top surface of the metal substrate to be plated later;

step 20, plating with a fourth metal wiring layer, wherein the region of the top surface of the metal substrate from which the part of the photoresist film has been removed in step 19 is plated with the fourth metal wiring layer, which serves as a conductive pillar to connect the third metal wiring layer to a fifth metal wiring layer;

step 21, removing the photoresist film, wherein the photoresist film on the surface of the metal substrate is removed;

step 22, applying with a non-conductive adhesive film, wherein the top surface of the metal substrate is applied with a layer of the non-conductive adhesive film;

step 23, grinding a surface of the non-conductive adhesive film, wherein the surface of the non-conductive adhesive film is ground after the applying the non-conductive adhesive film has been performed;

step 24, performing metallization pretreatment on the surface of the non-conductive adhesive film, wherein the metallization pretreatment is performed on the surface of the non-conductive adhesive film;

step 25, applying with a photoresist film, wherein the top surface and the bottom surface of the metal substrate in step 24 are applied with the photoresist film which can be exposed and developed;

step 26, removing a part of the photoresist film on the bottom surface of the metal substrate, wherein the top surface of the metal substrate, which has been applied with the photoresist film in step 25, is exposed and developed with a pattern using an exposure and development equipment, and the part of the photoresist film in the pattern is removed, so as to expose a region of the top surface of the metal substrate to be etched later;

step 27, etching;

wherein the etching is performed in a region from which the part of the photoresist film has been removed in step 26;

step 28, removing the photoresist film on the top surface of the metal substrate, wherein the photoresist film on the top surface of the metal substrate is removed;

step 29, plating with a fifth metal wiring layer, wherein the top surface of the metal substrate in step 28 is plated with the fifth metal wiring layer, so that a die pad and a lead are formed on the metal substrate;

step 30, applying with a photoresist film, wherein the top surface of the metal substrate in step 29 is applied with the photoresist film which can be exposed and developed;

step 31, removing a part of the photoresist film on the bottom surface of the metal substrate, wherein the bottom surface of the metal substrate, which has been applied with the photoresist film in step 30, is exposed and developed with a pattern using an exposure and development equipment, and the part of the photoresist film in the pattern is removed, so as to expose a region of the bottom surface of the metal substrate to be etched later;

step 32, chemical etching;

wherein the chemical etching is performed in a region on the bottom surface of the metal substrate in which exposing and developing have been performed in step 31, till the metal wiring layer is reached;

step 33, applying with a photoresist film, wherein the bottom surface of the metal substrate on which the chemical etching has been performed in step 32 is applied with the photoresist film which can be exposed and developed;

step 34, removing a part of the photoresist film on the bottom surface of the metal substrate, wherein the bottom surface of the metal substrate, which has been applied with the photoresist film in step 33, is exposed and developed with a pattern using an exposure and development equipment, and the part of the photoresist film in the pattern is removed, so as to expose a region of the bottom surface of the metal substrate to be plated later;

step 35, plating with a metal pillar, wherein the region of the bottom surface of the metal substrate from which the part of the photoresist film has been removed in step 34 is plated with the metal pillar;

step 36, removing the photoresist film, wherein the photoresist film on the surface of the metal substrate is removed;

step 37, coating with an adhesive material;

wherein a bottom surface of the die pad is coated with a conductive or non-conductive adhesive material after the photoresist film on the surface of the metal substrate has been removed in step 36;

step 38, bonding dies, wherein a chip is bonded in the conductive or non-conductive adhesive material in step 37;

step 39, bonding a metal wire, wherein the metal wire is bonded between a top surface of the chip and a top surface of the lead;

step 40, encapsulating, wherein the molding with epoxy resin, which is commonly known as a molding material, is performed on the bottom surface of the metal substrate in step 39;

step 41, grinding a surface of the epoxy resin, wherein the surface of the epoxy resin is ground after the molding with the epoxy resin has been performed in step 40;

step 42, plating with an anti-oxidizing metal layer or coating with an antioxidant, wherein an exposed surface of the metal substrate is plated with the anti-oxidizing metal layer or is coated with the antioxidant after the surface of the epoxy resin has been ground in step 41.

The steps 6 to 17 are repeated for times to form more metal wiring layers.

Compared with the prior art, the disclosure has the following beneficial effects.

1) Currently, a metal lead frame is manufactured through mechanical punching or chemical etching, where multiple metal wiring layers can not be formed, and no object can be embedded in an interlayer in a metal lead frame manufactured through mechanical punching, while an object can be embedded in an interlayer in a three-dimensional metal wiring composite-type substrate according to the present disclosure.

2) A heat conduction object or a heat dissipation object can be embedded as required at a position or in a region in the interlayer in the three-dimensional metal wiring composite-type substrate on a heat conduction or a heat dissipation requirement, to form a system-in-package metal lead frame with a good thermal property (referring to FIG. 87).

3) An active element or component or a passive component can be embedded as required at a position or in a region in the interlayer in the three-dimensional metal wiring composite-type substrate based on system and function requirements, to form a system-in-package metal lead frame.

4) it can not be seen from an appearance of a final product of the three-dimensional metal wiring composite-type substrate that an object for system and function requirements is embedded in the interlayer. Especially for a silicon chip, the embedment can not be detected even through X-ray, thereby achieving a privacy and security of the system and function;

5) Since the final product of the three-dimensional metal wiring composite-type substrate includes various components, an ultrathin package can be formed through cutting the three-dimensional metal wiring composite-type substrate in terms of each unit in a case of no subsequent second packaging.

6) Second packaging can be performed on the three-dimensional metal wiring composite-type substrate besides embedding of an object, thereby achieving integration of system functions.

7) Not only an object can be embedded in the three-dimensional metal wiring composite-type substrate, different unit packages or system-in-package can also be stacked on a periphery of a package of the three-dimensional metal wiring composite-type substrate, thereby achieving a dual-system package or a multi-system package.

8) The three-dimensional metal wiring substrate can be applied to a multichip module (MCM) package (referring to FIGS. 88 and 89), and has lower cost and higher toughness than a conventional MCM substrate.

BRIEF DESCRIPTION OF THE DRAWINGS

The embodiments of the disclosure are described in conjunction with drawings, so that the characteristics, advantages and object of the disclosure can be better understood.

Figure 1:
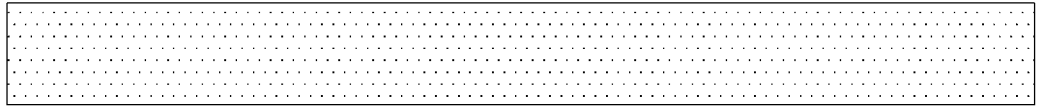
FIGS. 1 to 25 are diagrams of steps of a method for manufacturing a first-etched and later-packaged normal chip three-dimensional system-in-package metal wiring board of the present disclosure.

In the drawings, 1 represents a metal substrate frame, 2 represents a die pad, 3 represents a lead, 4 represents a conductive or nonconductive adhesive material, 5 represents a chip, 6 represents a metal wire, 7 represents a conductive pillar, 8 represents a molding material, 9 represents an anti-oxidizing layer or an antioxidant, 10 represents a passive device, 11 represents an electrostatic discharge coil, 12 represents a second chip, 13 represents a second conductive pillar and 14 represents a conductive material.

DETAILED DESCRIPTION

Technical solutions according to embodiments of the disclosure are described in detail hereinafter in conjunction with the drawings. It should be understood that the described embodiments are only a part rather than all of the embodiments according to the present disclosure. Other embodiments obtained by those skilled in the art based on the embodiments in the present disclosure without any creative work fall in the scope of protection of the present disclosure. An first-etched and later-packaged normal chip three-dimensional system-in-package metal wiring board structure and a method therefor are provided as follows.

Figure 26:
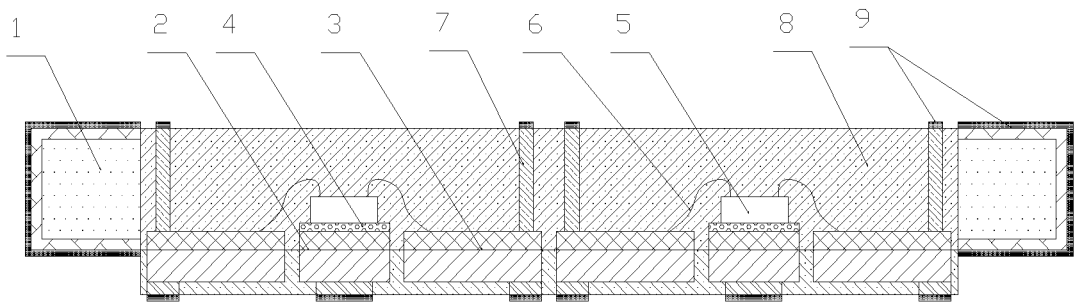
FIG. 26 is a diagram of an first-etched and later-packaged normal chip three-dimensional system-in-package metal board structure according to the first embodiment of the disclosure.

A First Embodiment: Single-Layer Wiring, Single Normal Chip and Single Ring of Leads Referring to FIG. 26, a diagram of an first-etched and later-packaged normal chip three-dimensional system-in-package metal wiring board structure according to the first embodiment of the disclosure is shown. The structure includes a metal substrate frame 1, where a die pad 2 and a lead 3 are provided in the metal substrate frame 1, a chip 5 is provided on the top surface of the die pad 2 via a conductive or nonconductive adhesive material 4, and the top surface of the chip 5 and the top surface of the lead 3 are connected through a metal wire 6. A conductive pillar 7 is provided on the top surface of the lead 3. A peripheral region of the die pad 2, a region between the die pad 2 and the lead 3, a region between the lead 3 and another lead 3, a region above the die pad 2 and the lead 3, a region below the die pad 2 and the lead 3, and regions outside the chip 5, the metal wire 6 and the conductive pillar 7 are encapsulated with a molding material 8. The molding material 8 is flush with a top of the conductive pillar 7. Surfaces of the metal substrate frame 1, the die pad 2, the lead 3 and the conductive pillar 7 exposed out of the molding material 8 are plated with an anti-oxidizing layer or are coated with an antioxidant (OSP) 9.

The process method includes steps 1 to 25.

Step 1 may include providing a metal substrate.

As illustrated in FIG. 1, a metal substrate with an appropriate thickness is provided. The metal substrate is only used as a transitive material for supporting a wiring layer structure in wiring fabrication and subsequent packaging. The metal substrate is mainly made of a metal material, where the metal material may be copper, iron, galvanized material, stainless steel, aluminum, any other conductive metal material or a conductive non-all-metal material.

Step 2 may include pre-plating a surface of the metal substrate with a micro copper layer.

Figure 2:
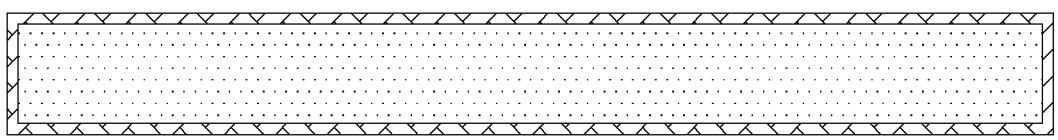

As illustrated in FIG. 2, the surface of the metal substrate is pre-plated with the micro copper layer. Thickness of the micro copper layer ranges from 2 µm to 10 µm, where the micro copper layer may be thinner or thicker based on a functional requirement, to form a tight integration of the wiring layer and the metal substrate in subsequent wiring fabrication. The pre-plating may be implemented through chemical deposition or electrolytic plating.

Step 3 may include applying a photoresist film.

Figure 3:
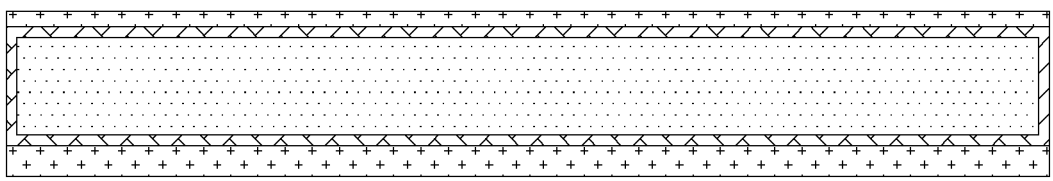

As illustrated in FIG. 3, a top surface and a bottom surface of the metal substrate which have been pre-plated with the micro copper layer are respectively applied with the photoresist film which can be exposed and developed. The photoresist film may be a dry photoresist film or a wet photoresist film.

Step 4 may include removing a part of the photoresist film on the bottom surface of the metal substrate.

Figure 4:
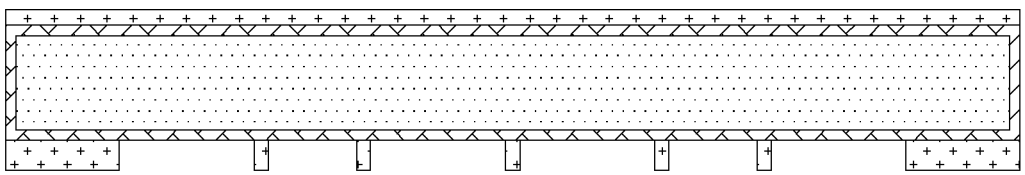

As illustrated in FIG. 4, the bottom surface of the metal substrate, which has been pasted with the photoresist film in step 3, is exposed and developed with a pattern using an exposure and development equipment, and the part of the photoresist film in the pattern is removed, so as to expose a region of the bottom surface of the metal substrate to be plated later.

Step 5 may include plating with a metal wiring layer.

Figure 5:
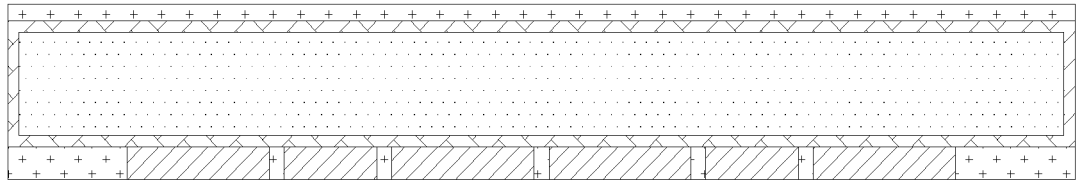

As illustrated in FIG. 5, wiring the bottom surface of the metal substrate in the region where the photoresist film is removed in step 4 is plated with a metal wiring layer. The metal wiring layer may be made of a material such as copper, aluminum, nickel, silver, gold, copper-silver, nickel-gold, or nickel-palladium-gold (plating thickness usually ranges from 5 µm to 20 µm and may be varied based on different properties), and of course any other conductive metal material may be feasible, without limitation to metal material such as copper, aluminum, nickel, silver, gold, copper-silver, nickel-gold, or nickel-palladium-gold. The plating may be implemented through chemical deposition or electrolytic plating.

Step 6 may include applying a photoresist film.

Figure 6:
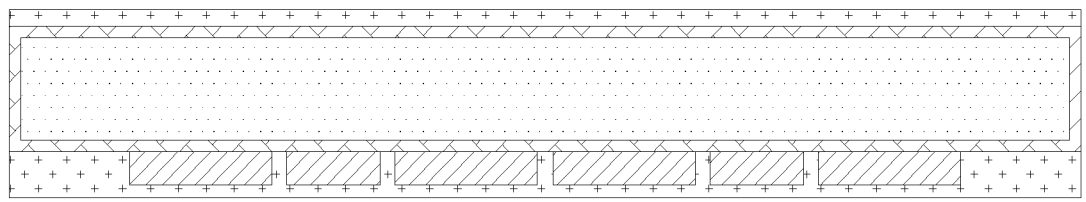

As illustrated in FIG. 6, the bottom surface of the metal substrate in step 5 is applied with the photoresist film which can be exposed and developed. The photoresist film may be a dry photoresist film or a wet photoresist film.

Step 7 may include removing a part of the photoresist film on the bottom surface of the metal substrate.

Figure 7:
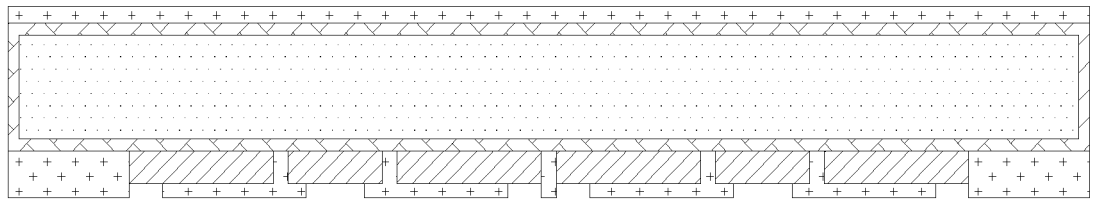

As illustrated in FIG. 7, the bottom surface of the metal substrate, which has been pasted with the photoresist film in step 6, is exposed and developed with a pattern using an exposure and development equipment, and the part of the photoresist film in the pattern is removed, so as to expose a region of the bottom surface of the metal substrate to be plated later.

Step 8 may include plating with a high-conductivity metal wiring layer.

Figure 8:
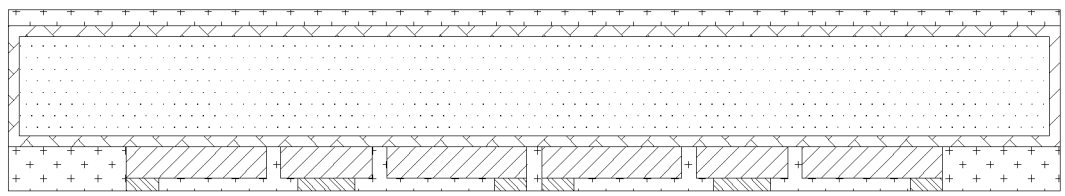

As illustrated in FIG. 8, the bottom surface of the metal substrate in the region where the photoresist film is removed in step 7 is plated with a high-conductivity metal wiring layer. The high-conductivity metal wiring layer may be made of material such as copper, aluminum, nickel, silver, gold, copper-silver, nickel-gold, or nickel-palladium-gold, and of course any other conductive metal material may be feasible, without limitation to metal material such as copper, aluminum, nickel, silver, gold, copper-silver, nickel-gold, or nickel-palladium-gold. The plating may be implemented through chemical deposition or electrolytic plating.

Step 9 may include removing the photoresist film.

Figure 9:
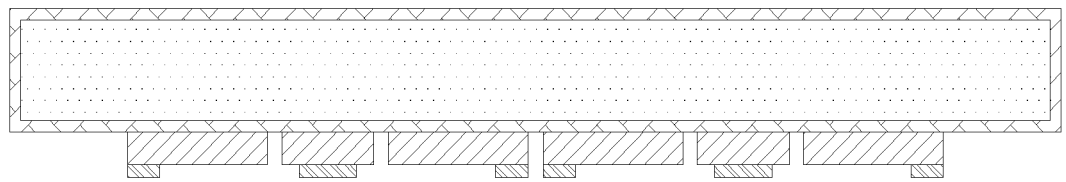

As illustrated in FIG. 9, the photoresist film on the surface of the metal substrate is removed. The photoresist film may be removed through softening with a chemical potion and then flushing with high-pressure water.

Step 10 may include molding an epoxy resin.

Figure 10:
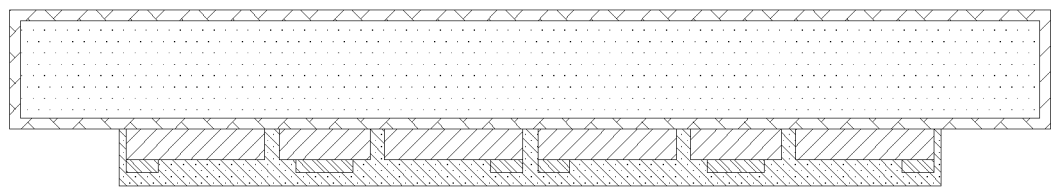

As illustrated in FIG. 10, the molding with the epoxy resin for protection is performed on surfaces of the metal wiring layer and the metal wiring layer with high-conductivity both of which are on the bottom surface of the metal substrate. An epoxy resin with or without a filler may be selected depending on a product property. The encapsulating may be implemented through pouring glue with a mold, spraying with a spray device, pasting a film or brush coating.

Step 11 may include grinding a surface of the epoxy resin.

Figure 11:
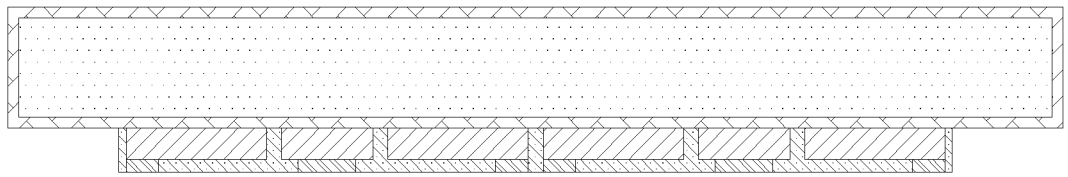

As illustrated in FIG. 11, the surface of the epoxy resin is grinded after the molding with the epoxy resin, in order to expose, the metal wiring layer with high-conductivity for fabricating an outer lead, out of a surface of the plastic package, and control thickness of the epoxy resin.

Step 12 may include applying a photoresist film.

Figure 12:
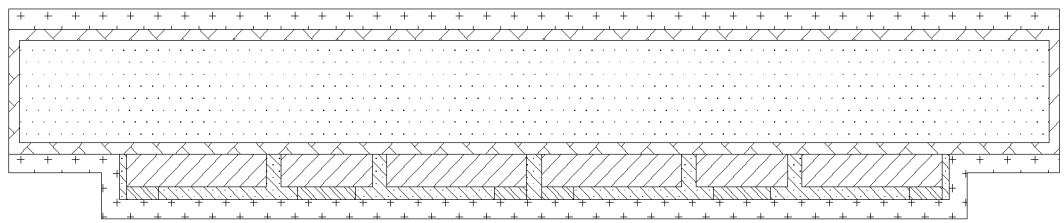

As illustrated in FIG. 12, the top surface and the bottom surface of the metal substrate are applied with the photoresist film which can be exposed and developed after the surface of the epoxy resin has been ground in step 11. The photoresist film may be a dry photoresist film or a wet photoresist film.

Step 13 may include removing a part of the photoresist film on the top surface of the metal substrate.

Figure 13:
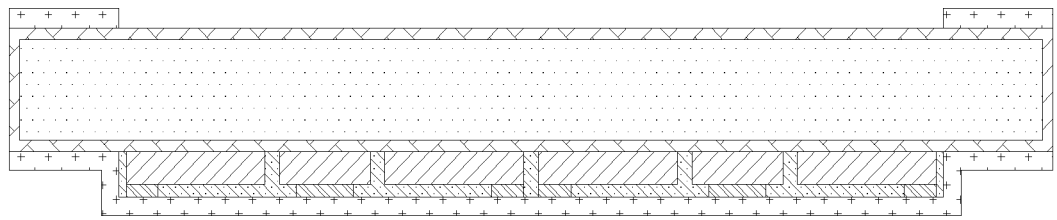

As illustrated in FIG. 13, the top surface of the metal substrate, which has been applied with the photoresist film in step 12, is exposed and developed with a pattern using an exposure and development equipment, and the part of the photoresist film in the pattern is removed, so as to expose a region of the top surface of the metal substrate to be etched later.

Step 14 may include performing chemical etching.

Figure 14:
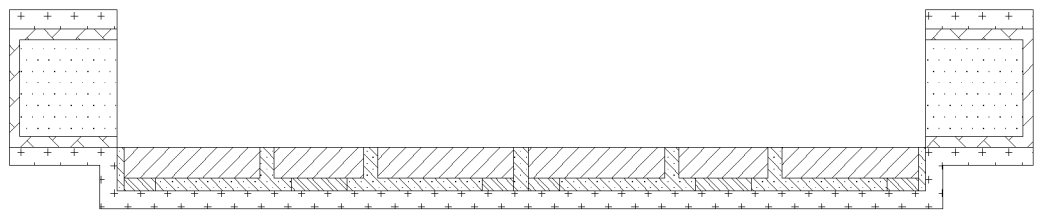

As illustrated in FIG. 14, chemical etching is performed on the top surface of the metal substrate in a region exposed and developed in step 13, and is stopped until a metal wiring layer is reached. A chemical potion for etching may be copper chloride, ferric chloride or any other chemical potion available for chemical etching.

Step 15 may include plating with a metal layer.

Figure 15:
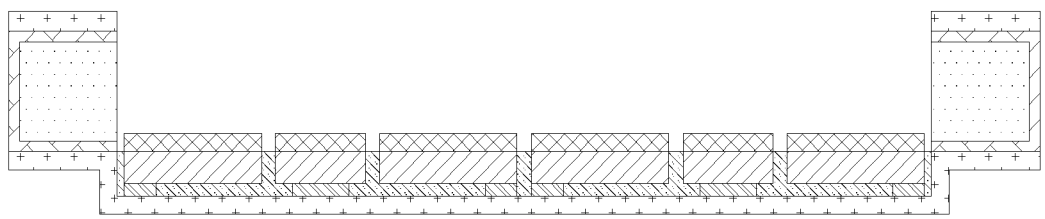

As illustrated in FIG. 15, the top surface of the metal substrate on which the chemical etching has been performed in step 14 is plated with a metal layer, so that a die pad and a lead are formed on the metal substrate. The metal wiring layer may be made of material such as copper, aluminum, nickel, silver, gold, copper-silver, nickel-gold, or nickel-palladium-gold, and of course any other conductive metal material may be feasible, without limitation to metal material such as copper, aluminum, nickel, silver, gold, copper-silver, nickel-gold, or nickel-palladium-gold. The plating may be implemented through chemical deposition or electrolytic plating.

Step 16 may include applying a photoresist film.

Figure 16:
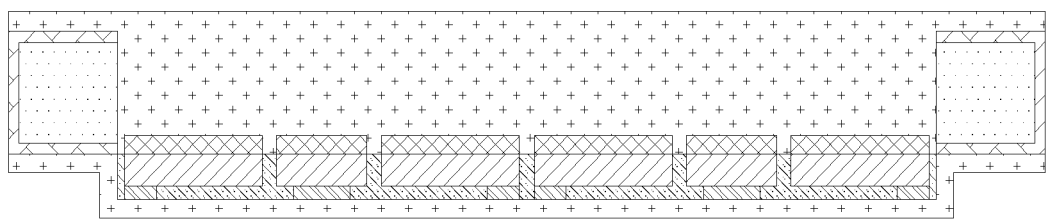

As illustrated in FIG. 16, the top surface and the bottom surface of the metal substrate are applied with the photoresist film which can be exposed and developed after the plating with the metal layer has been performed in step 15. The photoresist film may be a dry photoresist film or a wet photoresist film.

Step 17 may include removing a part of the photoresist film on the top surface of the metal substrate.

Figure 17:
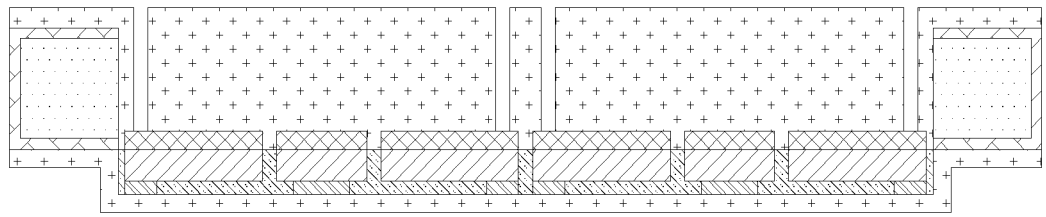

As illustrated in FIG. 17, the top surface of the metal substrate, which has been applied with the photoresist film in step 16, is exposed and developed with a pattern using an exposure and development equipment, and the part of the photoresist film in the pattern is removed, so as to expose a region of the top surface of the metal substrate to be plated later.

Step 18 may include plating with a metal pillar.

Figure 18:
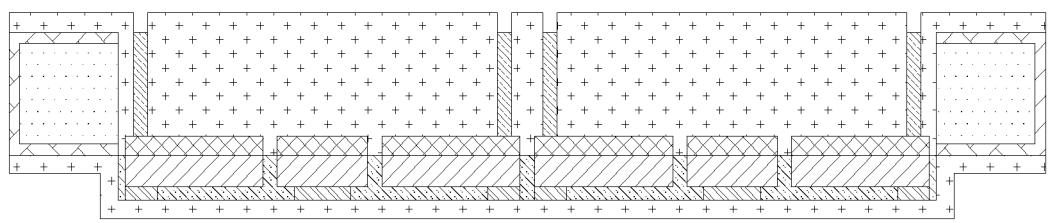

As illustrated in FIG. 18, the region of the top surface of the metal substrate from which the part of the photoresist film has been removed in step 17 is plated with the metal pillar. The metal pillar may be made of material such as copper, aluminum, nickel, silver, gold, copper-silver, nickel-gold, or nickel-palladium-gold, and of course any other conductive metal material may be feasible, without limitation to metal material such as copper, aluminum, nickel, silver, gold, copper-silver, nickel-gold, or nickel-palladium-gold. The plating may be implemented through chemical deposition or electrolytic plating.

Step 19 may include removing the photoresist film.

Figure 19:
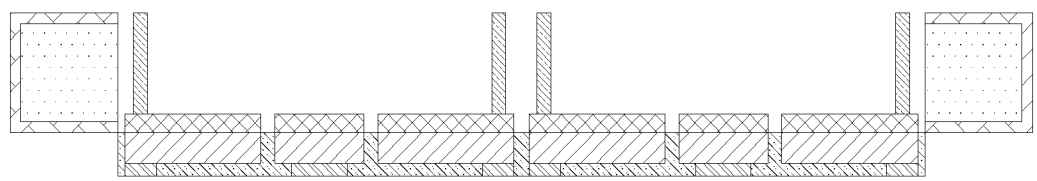

As illustrated in FIG. 19, the photoresist film on the surface of the metal substrate is removed. The photoresist film may be removed through softening with a chemical potion and then flushing with high-pressure water.

Step 20 may include coating with an adhesive material.

Figure 20:
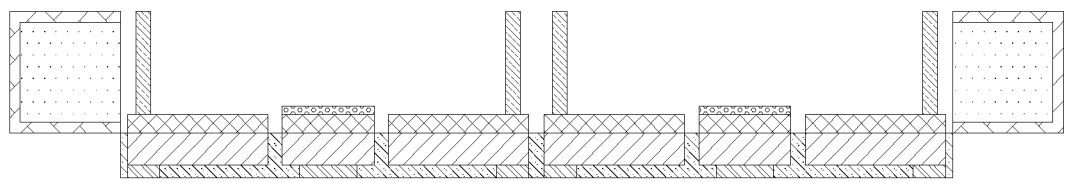

As illustrated in FIG. 20, a top surface of the die pad is coated with a conductive or non-conductive adhesive material after the die pad has been formed in step 15, for the purpose of integration of the die pad and a subsequently embedded chip.

Step 21 may include bonding dies.

Figure 21:
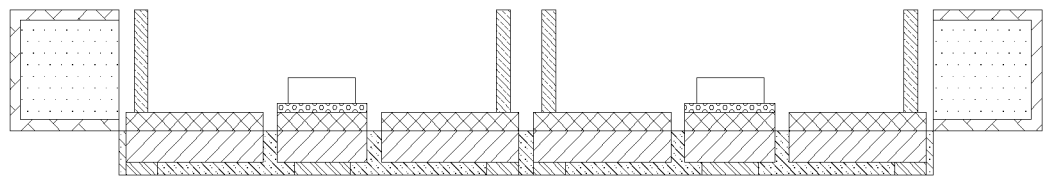

As illustrated in FIG. 21, a chip is bonded in the conductive or nonconductive adhesive material in step 20.

Step 22 may include bonding a metal wire.

Figure 22:
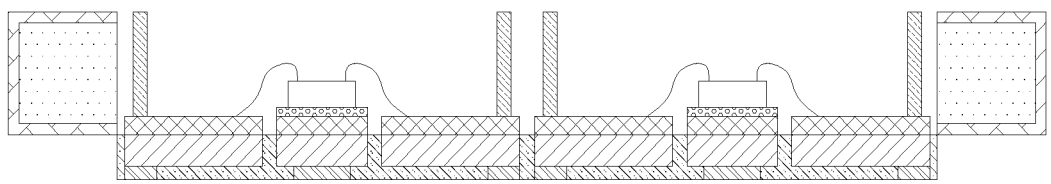

As illustrated in FIG. 22, the metal wire is bonded between a top surface of the chip and a top surface of the lead. The metal wire may be made of gold, silver, copper, aluminum or alloy, and a shape of the metal wire may be a filament or a strip.

Step 23 may include encapsulating.

Figure 23:
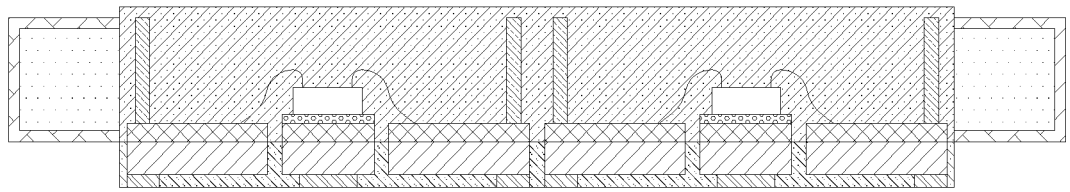

As illustrated in FIG. 23, the molding with a molding material is performed on the top surface of the metal substrate in step 22. The molding may be implemented through pouring glue with a mold, spraying with a spray device, or pasting a film. The molding material may be an epoxy resin with or without a filler.

Step 24 may include grinding a surface of the epoxy resin.

Figure 24:
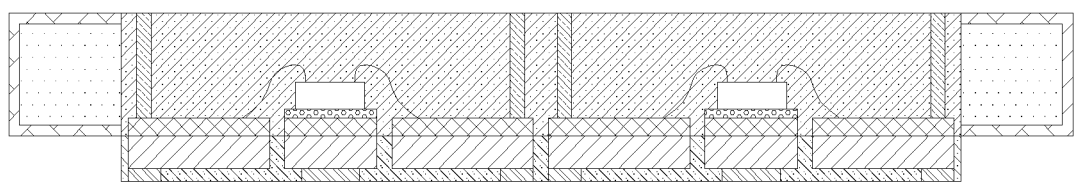

As illustrated in FIG. 24, the surface of the epoxy resin is grinded after the molding with the epoxy resin has been performed in step 23, in order to expose the metal pillar out of the surface of the plastic package, and control thickness of the epoxy resin.

Step 25 may include plating with an anti-oxidizing metal layer or coating with an antioxidant OSP.

Figure 25:
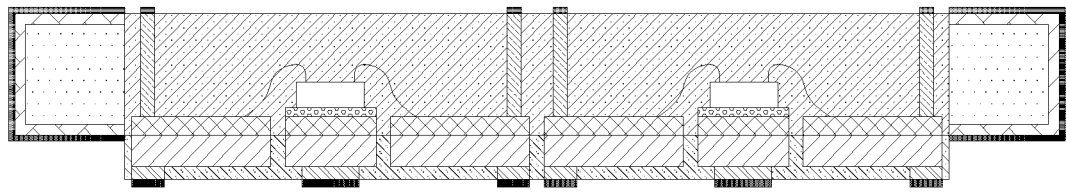

As illustrated in FIG. 25, an exposed surface of the metal substrate is plated with the anti-oxidizing metal layer such as gold, nickel-gold, nickel-palladium-gold or tin, or is coated with the antioxidant (OSP), after the surface of the epoxy resin has been ground in step 24.

Figure 27:
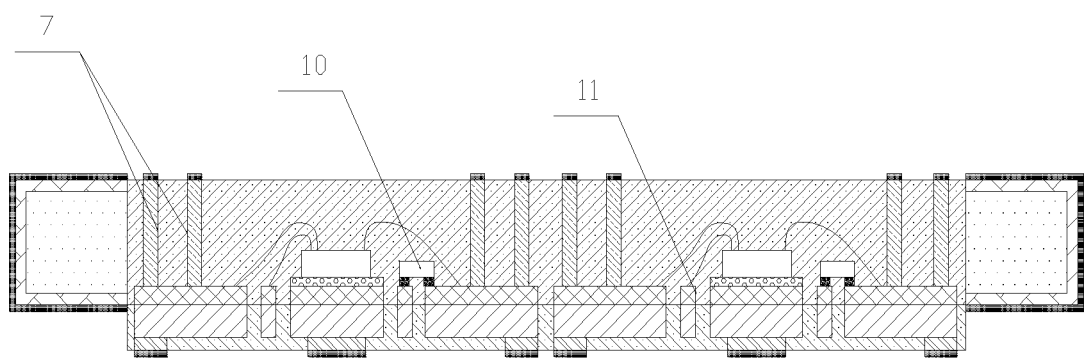
FIG. 27 is a diagram of an first-etched and later-packaged normal chip three-dimensional system-in-package metal board structure according to the second embodiment of the disclosure.

A second embodiment: Multiple Rings of Leads, Single Normal Chip, Passive Device and Electrostatic Discharge Coil Referring to FIG. 27, a diagram of an first-etched and later-packaged normal chip three-dimensional system-in-package metal wiring board structure according to the second embodiment is shown. The second embodiment differs from the first embodiment in that: there are multiple rings of conductive pillars 7, a passive device 10 is connected across the lead 3 and another lead 3 via a conductive adhesive material, and an electrostatic discharge coil 11 is provided between a die pad 2 and the lead 3. The top surface of the electrostatic discharge coil 11 and the top surface of the chip 5 are connected through a metal wire 6, and the passive device 10 may be connected across the top surface of the lead 3 and the top surface of another lead 3, across the top surface of the lead 3 and the top surface of the electrostatic discharge coil 11, or across the top surface of the die pad 2 and the top surface of the electrostatic discharge coil 11.

Figure 28:
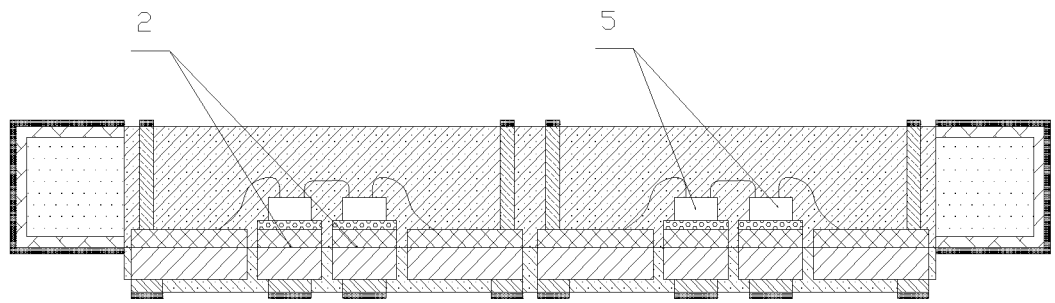
FIG. 28 is a diagram of an first-etched and later-packaged normal chip three-dimensional system-in-package metal board structure according to the third embodiment of the disclosure.

A third embodiment: Single Ring of Leads, Multiple Tiled Die Pads, and Multiple Normal Chips Referring to FIG. 28, a diagram of an first-etched and later-packaged normal chip three-dimensional system-in-package metal wiring board structure according to the third embodiment of the disclosure is shown. The third embodiment differs from the first embodiment in that: there are multiple die pads 2, and a chip 5 is provided on each of the die pads 2 via a conductive or nonconductive adhesive material 4, and the top surface of the chip 5 and the top surface of another chip 5 are connected through a metal wire 6.

A Fourth Embodiment: Single Ring of Leads, Multiple Stacked Normal Chips

Figure 29:
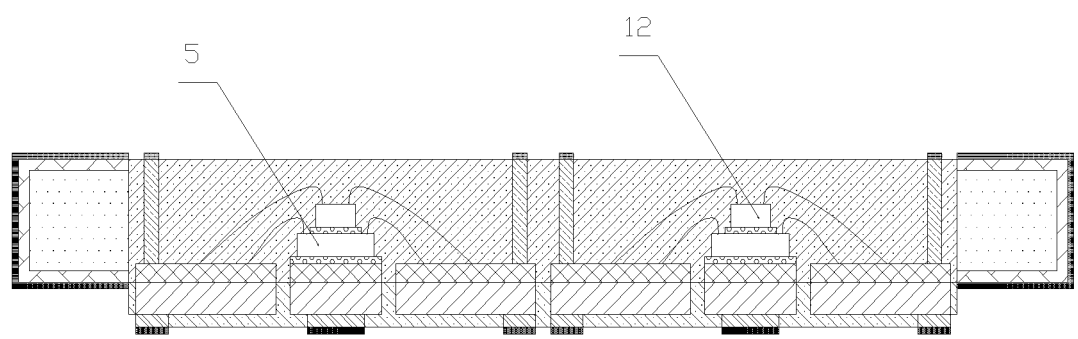
FIG. 29 is a diagram of an first-etched and later-packaged normal chip three-dimensional system-in-package metal board structure according to the fourth embodiment of the disclosure.

Referring to FIG. 29, a diagram of an first-etched and later-packaged normal chip three-dimensional system-in-package metal wiring board structure according to the fourth embodiment of the disclosure is shown. The fourth embodiment differs from the first embodiment in that: a second chip 12 is provided on the top surface of the chip 5 via a conductive or nonconductive adhesive material 4, and the top surface of the second chip 12 and the top surface of the lead 3 are connected through a metal wire 6.

Figure 30:
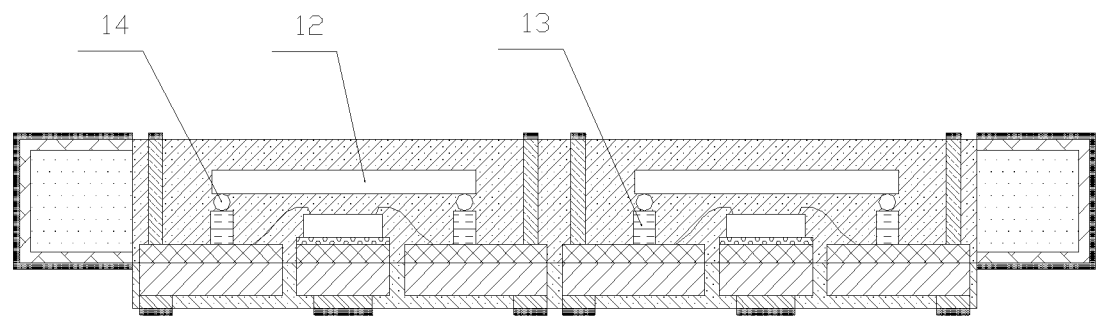
FIG. 30 is a diagram of an first-etched and later-packaged normal chip three-dimensional system-in-package metal board structure according to the fifth embodiment of the disclosure.

A Fifth Embodiment: Single Ring of Leads, Multiple Stacked Normal and Flipped Chips Referring to FIG. 30, a diagram of an first-etched and later-packaged normal chip three-dimensional system-in-package metal wiring board structure according to the fifth embodiment of the disclosure is shown. The fifth embodiment differs from the first embodiment in that: a second conductive pillar 13 is provided on the top surface of the lead 3, and a second chip 12 is flipped on the second conductive pillar 13 via a conductive material 14, and the second conductive pillar 13 and the second chip 12 are provided inside the molding material 8.

A Sixth Embodiment: No Die Pad, and Single Normal Chip

Figure 31:
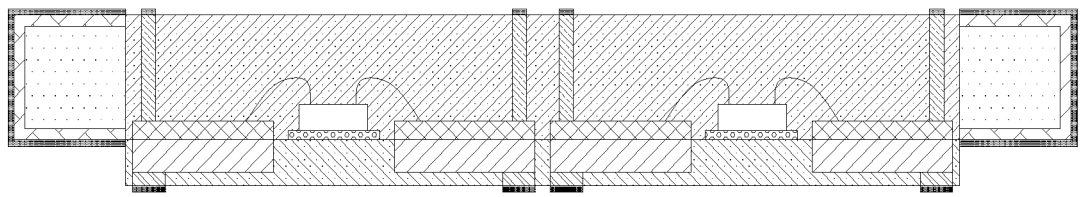
FIGS. 31 and 32 are diagrams of an first-etched and later-packaged normal chip three-dimensional system-in-package metal board structure according to the sixth embodiment of the disclosure.
Figure 32:
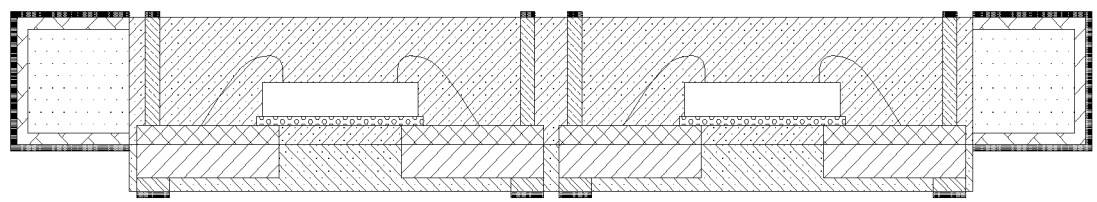

Referring to FIGS. 31 and 32, diagrams of an first-etched and later-packaged normal chip three-dimensional system-in-package metal wiring board structure according to the sixth embodiment of the disclosure are shown. The sixth embodiment differs from the first embodiment in that: the metal wiring board structure does not include a die pad 2, and a chip 5 is provided on the top surface of the metal substrate 1 or between the top surface of the lead 3 and the top surface of another lead 3 via a conductive or nonconductive adhesive material 4.

Figure 75:
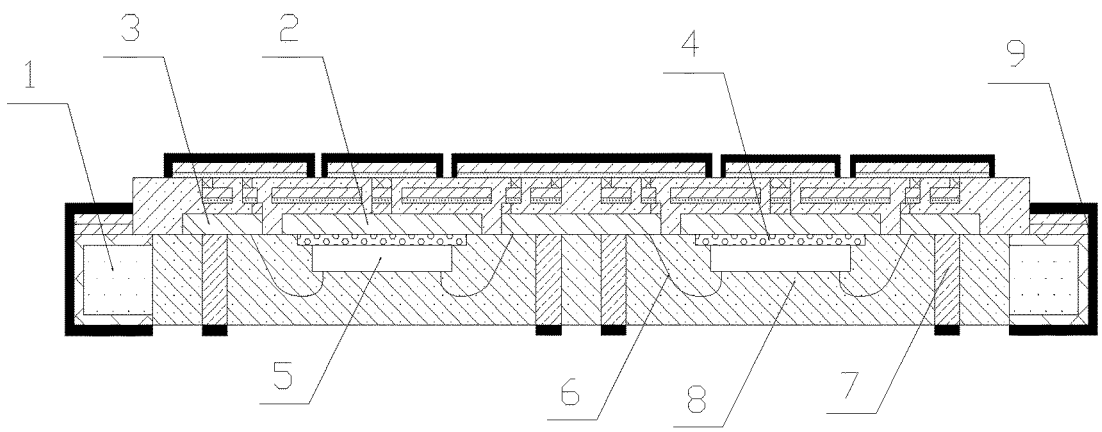
FIG. 75 is a diagram of an first-etched and later-packaged normal chip three-dimensional system-in-package metal board structure according to the seventh embodiment of the disclosure.
Figure 76:
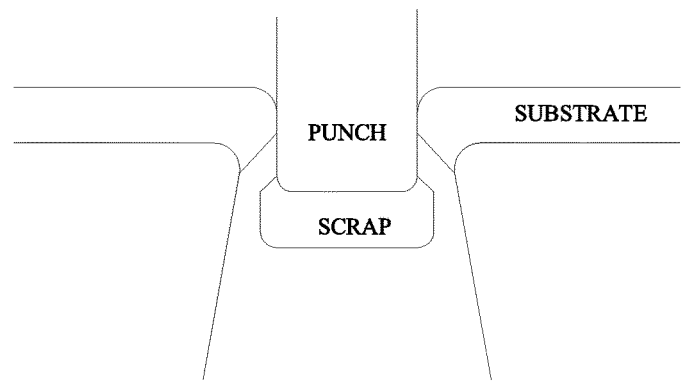
FIG. 76 is a diagram of a punching operation in the method for manufacturing a metal lead frame in the prior art.
Figure 77:
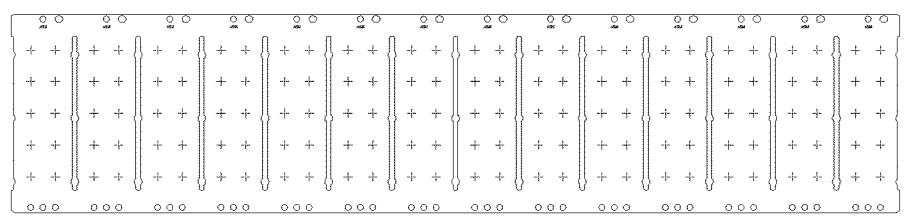
FIG. 77 is a diagram of a metal strip in manufacturing a metal lead frame in the prior art.
Figure 78:
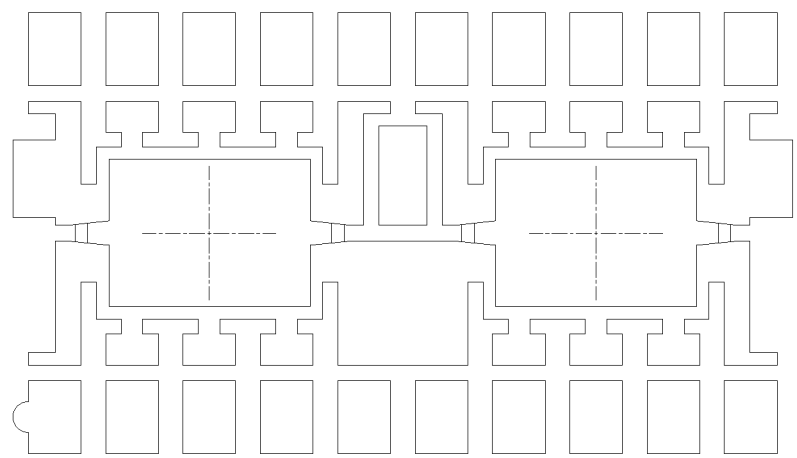
FIG. 78 is a top surface view of a lead frame in manufacturing a metal lead frame in the prior art.
Figure 79:
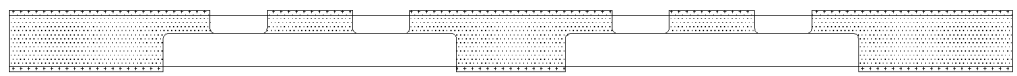
FIG. 79 is a sectional view of a metal lead frame in processes of exposing, developing, windowing and etching in the prior art.
Figure 80:
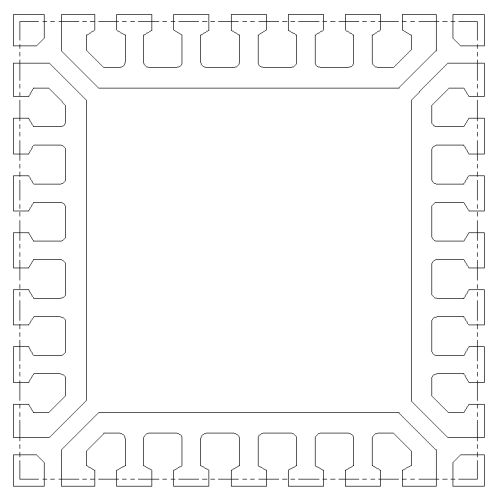
FIG. 80 is a top surface view of a lead frame in manufacturing a metal lead frame in the prior art.
Figure 81:
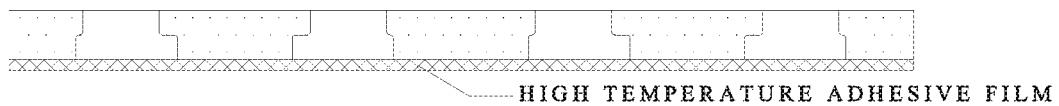
FIG. 81 is a sectional view of a QFN (Quad Flat No-lead) package in manufacturing a metal lead frame in the prior art.
Figure 82:
FIG. 82 is a diagram of a pre-filled lead frame in manufacturing a metal lead frame in the prior art.
Figure 83:
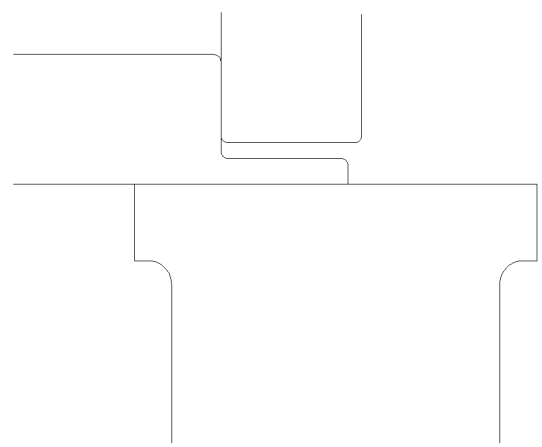
FIG. 83 is a diagram of extruding with a top blade and a bottom blade to form an extended region in manufacturing a metal lead frame in the prior art.
Figure 84:
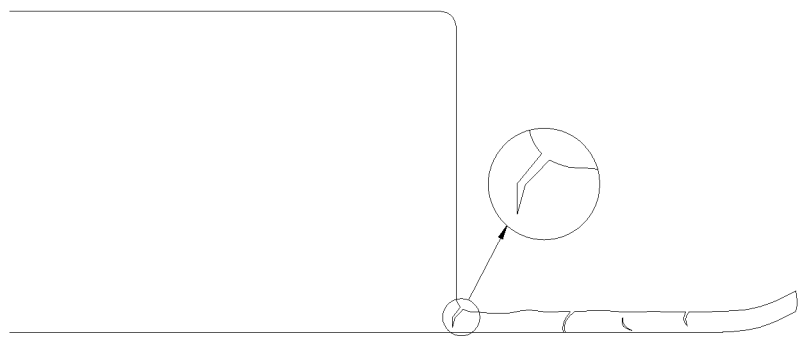
FIG. 84 is a diagram of a subfissure, a rupture and a warpage generated in extruding with a top blade and a bottom blade to form an extended region in manufacturing a metal lead frame in the prior art.
Figure 85:
FIG. 85 is a diagram of an extended region formed through extruding with a top blade and a bottom blade in manufacturing a metal lead frame in the prior art is smaller than 80% of length of a lead frame.
Figure 86:
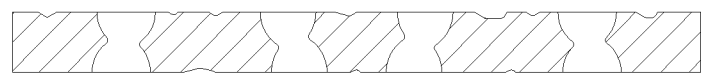
FIG. 86 is a diagram of an extended region which is formed through extruding with a top blade and a bottom blade in manufacturing a metal lead frame in the prior art is smaller than 80% of length of a lead frame and is difficult for embedding an object.
Figure 87:
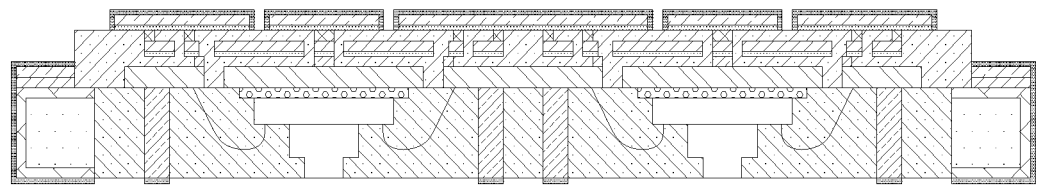
FIG. 87 is a diagram of a case that a heat conduction object or a heat dissipation object is embedded as required at a position or in a region in an interlayer in a three-dimensional metal wiring composite-type substrate on a heat conduction requirement or a heat dissipation requirement.
Figure 88:
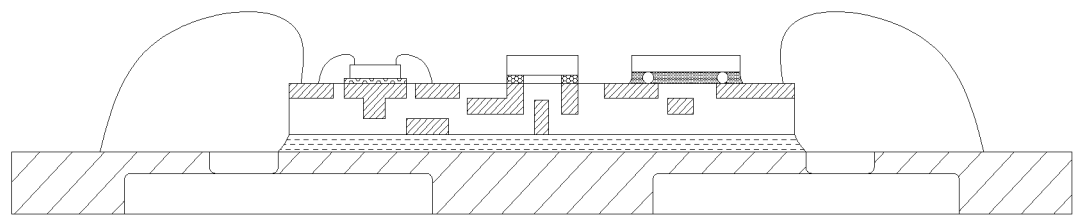
FIG. 88 is a diagram of applying with a three-dimensional metal wiring substrate to a multichip module (MCM) package.
Figure 89:
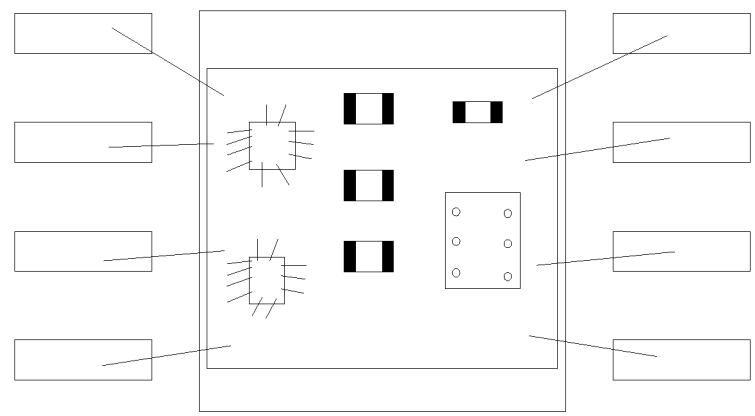
FIG. 89 is a top view for FIG. 88.

A Seventh Embodiment: Multiple Wiring Layers, Single Normal Chip, and Single Ring of Leads Referring to FIG. 75, a structural diagram of an first-etched and later-packaged normal chip three-dimensional system-in-package metal wiring board structure according to the seventh embodiment of the disclosure is shown. The seventh embodiment differs from embodiment 1 in that: the die pad 2 or the lead 3 includes multiple metal wiring layers, where two adjacent metal wiring layers are connected through a conductive pillar, a chip is provided on the back of the die pad 2 via a conductive or nonconductive material 4, and a conductive pillar 7 is provided on the back of the lead 3.

A method therefor includes steps 1 to 42.

Step 1 may include providing a metal substrate.

Figure 33:
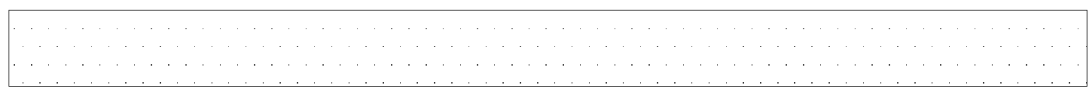
FIGS. 33 to 74 are flowcharts of processes for manufacturing an first-etched and later-packaged normal chip three-dimensional system-in-package metal board structure according to the seventh embodiment of the disclosure.

As illustrated in FIG. 33, a metal substrate with an appropriate thickness is provided. The metal substrate is only used as a transitive material for supporting a wiring layer structure in wiring fabrication and subsequent packaging. The metal substrate is mainly made of a metal material, where the metal material may be copper, iron, galvanized material, stainless steel, aluminum, any other conductive metal material or a conductive non-all-metal material.

Step 2 may include pre-plating a surface of the metal substrate with a micro copper layer.

Figure 34:
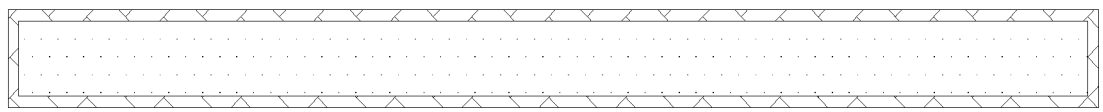

As illustrated in FIG. 34, the surface of the metal substrate is pre-plated with the micro copper layer. Thickness of the micro copper layer ranges from 2 μm to 10 μm, where the micro copper layer may be thinner or thicker based on a functional requirement, to form a tight integration of the wiring layer and the metal substrate in subsequent wiring fabrication. The pre-plating may be implemented through chemical deposition or electrolytic plating.

Step 3 may include applying with a photoresist film.

Figure 35:
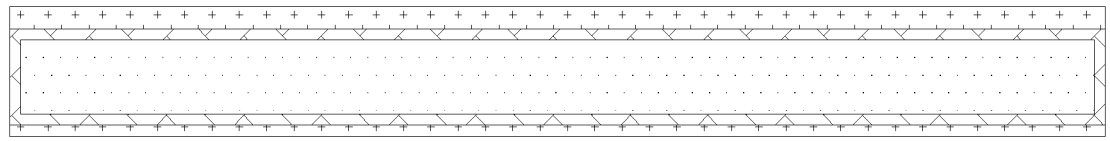

As illustrated in FIG. 35, a top surface and a bottom surface of the metal substrate which have been pre-plated with the micro copper layer are respectively applied with the photoresist film which can be exposed and developed, to protect subsequent operations of plating metal layers. The photoresist film may be a dry photoresist film or a wet photoresist film.

Step 4 may include removing a part of the photoresist film on the top surface of the metal substrate.

Figure 36:
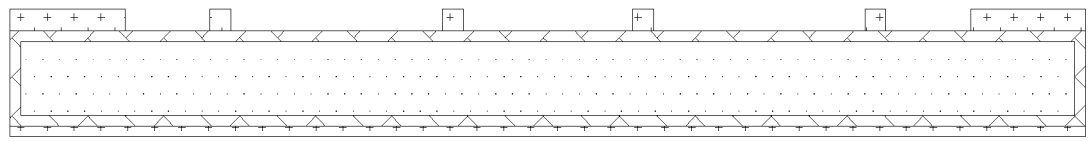

As illustrated in FIG. 36, the top surface of the metal substrate, which has been applied with the photoresist film in step 3, is exposed and developed with a pattern using an exposure and development equipment, and the part of the photoresist film in the pattern is removed, so as to expose a region of the top surface of the metal substrate to be plated later.

Step 5 may include plating with a first metal wiring layer.

Figure 37:
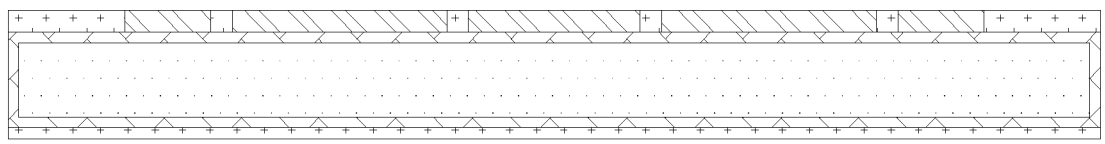

As illustrated in FIG. 37, the region of the top surface of the metal substrate from which the part of the photoresist film has been removed in step 4 is plated with the first metal wiring layer. The first metal wiring layer may be made of a material such as copper, aluminum, nickel, silver, gold, copper-silver, nickel-gold, or nickel-palladium-gold (plating thickness usually ranges from 5 μm to 20 μm and may be varied based on different properties), and of course any other conductive metal material may be feasible, without limitation to metal material such as copper, aluminum, nickel, silver, gold, copper-silver, nickel-gold, or nickel-palladium-gold. The plating may be implemented through chemical deposition or electrolytic plating.

Step 6 may include applying with a photoresist film.

Figure 38:
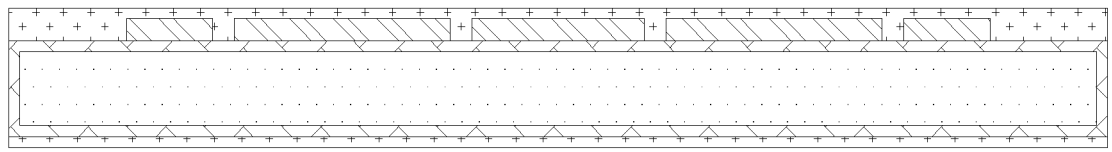

As illustrated in FIG. 38, the top surface of the metal substrate in step 5 is applied with the photoresist film which can be exposed and developed. The photoresist film may be a dry photoresist film or a wet photoresist film.

Step 7 may include removing a part of the photoresist film on the top surface of the metal substrate.

Figure 39:
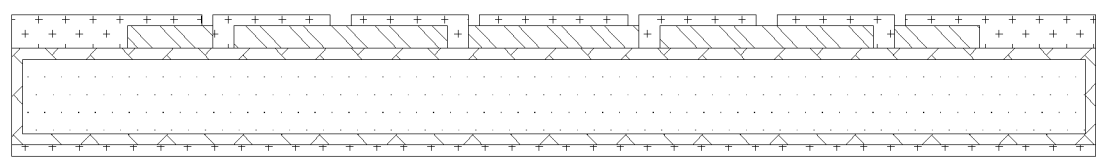

As illustrated in FIG. 39, the top surface of the metal substrate, which has been applied with the photoresist film in step 6, is exposed and developed with a pattern using an exposure and development equipment, and the part of the photoresist film in the pattern is removed, so as to expose a region of the top surface of the metal substrate to be plated later.

Step 8 may include plating a second metal wiring layer.

Figure 40:
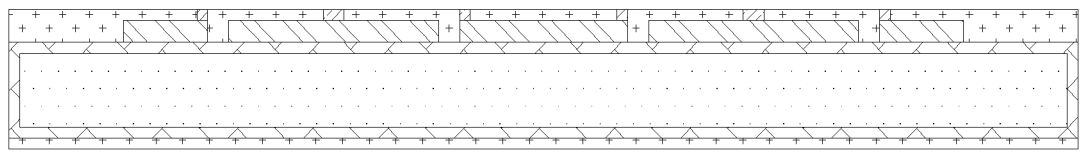

As illustrated in FIG. 40, the region of the top surface of the metal substrate from which the part of the photoresist film has been removed in step 7 is plated with the second metal wiring layer, which serves as a conductive pillar to connect the first metal wiring layer to a third metal wiring layer. The metal wiring layer may be made of copper, nickel-gold, nickel-palladium-gold, silver, gold, or tin. The plating may be implemented through chemical deposition or electrolytic plating.

Step 9 may include removing the photoresist film.

Figure 41:
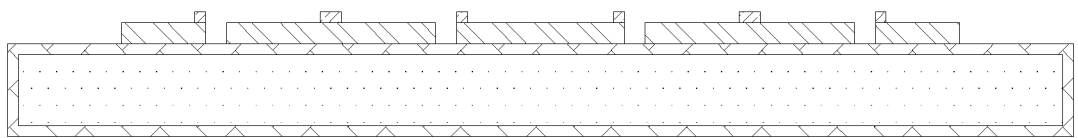

As illustrated in FIG. 41, the photoresist film on the surface of the metal substrate is removed, for an operation of pasting a nonconductive film subsequently. The photoresist film may be removed through softening with a chemical potion and then flushing with high-pressure water.

Step 10 may include applying with a nonconductive film.

Figure 42:
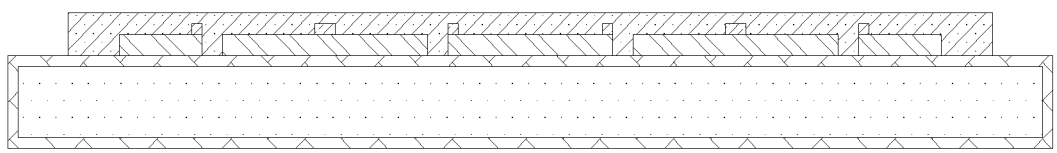

As illustrated in FIG. 42, the top surface of the metal substrate is applied with a layer of the non-conductive adhesive film, to insulate the first metal wiring layer from the third metal wiring layer. The applying may be pasted through a conventional rolling device, or be pasted in vacuum environment, to avoid residual air during the process of pasting. The nonconductive film is mainly a thermoset epoxy resin, and the epoxy resin may be a nonconductive film with or without a filler depending on a product property. The epoxy resin may be dyed depending on a product property.

Step 11 may include grinding a surface of the nonconductive film.

Figure 43:
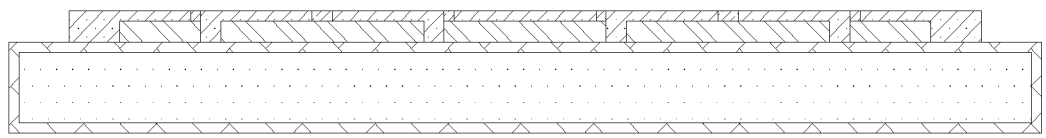

As illustrated in FIG. 43, the surface is grinded after the pasting of the nonconductive film, in order to expose the second metal wiring layer, maintain a flatness of the nonconductive film and the second metal wiring layer, and control thickness of the nonconductive film.

Step 12 may include performing metallization pretreatment on the surface of the nonconductive film.

Figure 44:
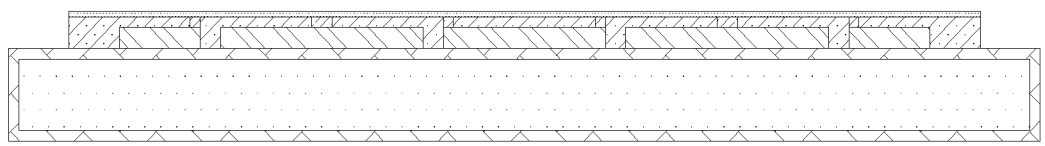

As illustrated in FIG. 44, the metallization pretreatment is performed on the surface of the nonconductive film to attach a layer of metalized polymer material, which serves as a catalytic converter to plate a metal material subsequently. Attaching the metalized polymer material may include spraying, plasma oscillating, surface roughening, and drying.

Step 13 may include applying with a photoresist film.

Figure 45:
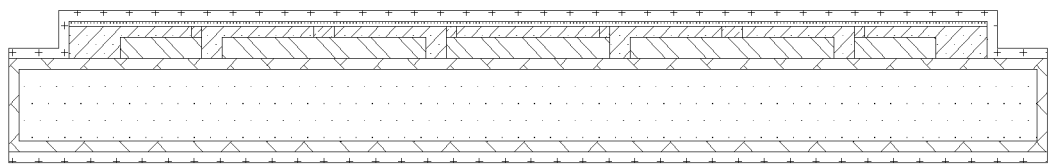

As illustrated in FIG. 45, the top surface and the bottom surface of the metal substrate in step 12 are applied with the photoresist film which can be exposed and developed, to protect subsequent operation of plating with the third metal wiring layer. The photoresist film may be a dry photoresist film or a wet photoresist film.

Step 14 may include removing a part of the photoresist film on the top surface of the metal substrate.

Figure 46:
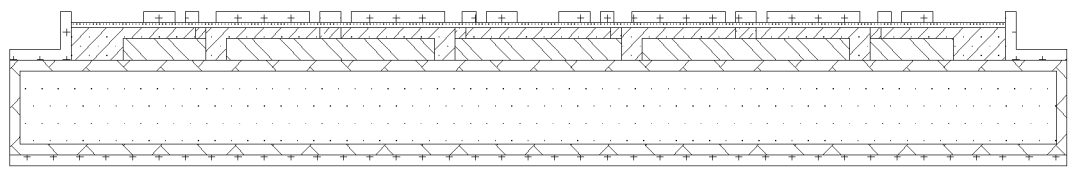

As illustrated in FIG. 46, the top surface of the metal substrate, which has been applied with the photoresist film in step 13, is exposed and developed with a pattern using an exposure and development equipment, and the part of the photoresist film in the pattern is removed, so as to expose a region of the top surface of the metal substrate to be etched later.

Step 15 may include etching.

Figure 47:
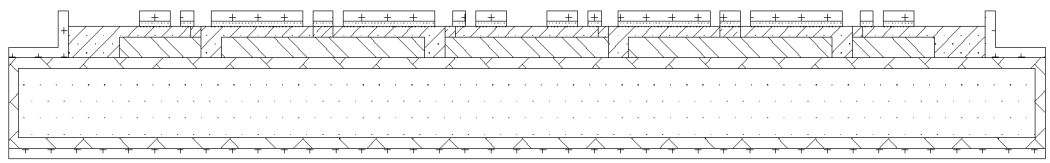

As illustrated in FIG. 47, the etching is performed in a region from which the part of the photoresist film has been removed in step 14, to completely erode metal regions except metal wirings required to be reserved. The etching may be performed with copper chloride, ferric chloride or any other chemical potion for etching.

Step 16 may include removing the photoresist film on the top surface of the metal substrate.

Figure 48:
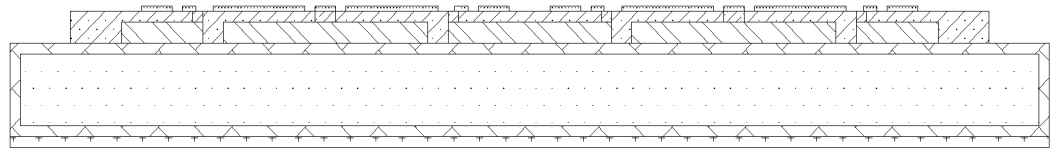

As illustrated in FIG. 48, the photoresist film on the top surface of the metal substrate is removed, to expose a pattern in a metal region required to be plated subsequently.

Step 17 may include plating with a third metal wiring layer.

Figure 49:
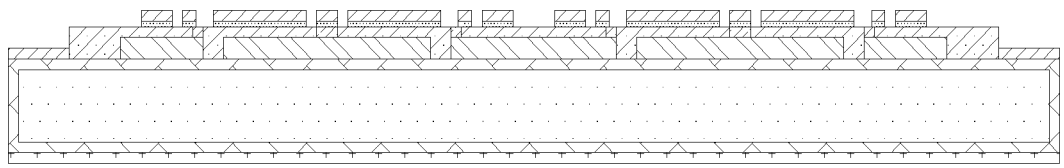

As illustrated in FIG. 49, the top surface of the metal substrate in step 16 is plated with the third metal wiring layer. The third metal wiring layer may be made of copper, nickel-gold, nickel-palladium-gold, silver, gold or tin. The plating may be implemented through chemical deposition and electrolytic plating or through only chemical deposition to obtain a required thickness.

Step 18 may include applying with a photoresist film.

Figure 50:
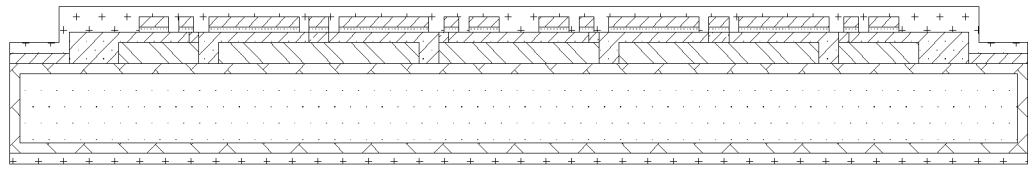

As illustrated in FIG. 50, the top surface of the metal substrate in step 17 is applied with the photoresist film which can be exposed and developed, for subsequent fabrication of metal wiring layers. The photoresist film may be a dry photoresist film or a wet photoresist film.

Step 19 may include removing a part of the photoresist film on the top surface of the metal substrate.

Figure 51:
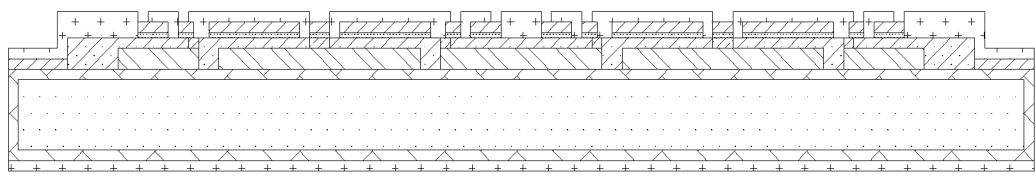

As illustrated in FIG. 51, the top surface of the metal substrate, which has been applied with the photoresist film in step 18, is exposed and developed with a pattern using an exposure and development equipment, and the part of the photoresist film in the pattern is removed, so as to expose a region of the top surface of the metal substrate to be plated later.

Step 20 may include plating with a fourth metal wiring layer.

Figure 52:
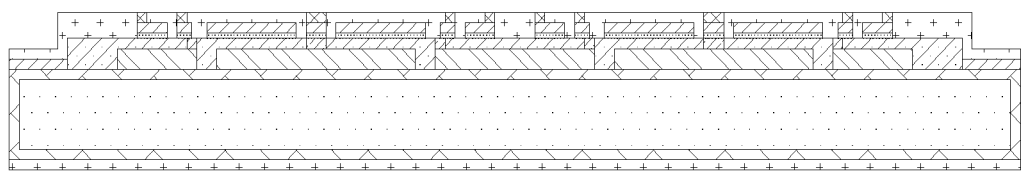

As illustrated in FIG. 52, the region of the top surface of the metal substrate from which the part of the photoresist film has been removed in step 19 is plated with the fourth metal wiring layer, which serves as a conductive pillar to connect the third metal wiring layer to a fifth metal wiring layer. The fourth metal wiring layer may be made of copper, nickel-gold, nickel-palladium-gold, silver, gold or tin. The plating may be implemented through chemical deposition or electrolytic plating.

Step 21 may include removing the photoresist film.

Figure 53:
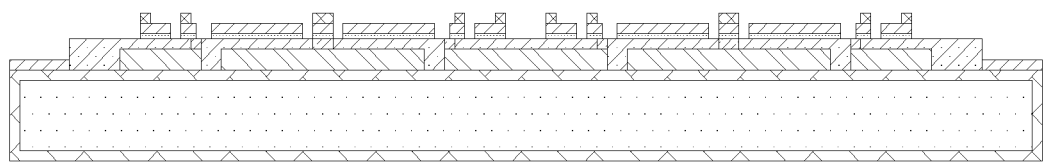

As illustrated in FIG. 53, the photoresist film on the surface of the metal substrate is removed, for an operation of pasting a nonconductive film subsequently. The photoresist film may be removed through softening with a chemical potion and then flushing with high-pressure water.

Step 22 may include applying with a nonconductive film.

Figure 54:
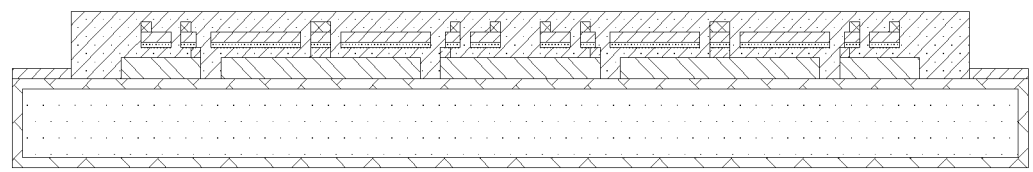

As illustrated in FIG. 54, the top surface of the metal substrate is applied with a layer of the non-conductive adhesive film, to insulate the third metal wiring layer from the fifth metal wiring layer. The nonconductive film may be pasted through a conventional rolling device, or be pasted in vacuum environment, to avoid residual air during the process of pasting. The nonconductive film is mainly a thermoset epoxy resin, and the epoxy resin may be a nonconductive film with or without a filler depending on a product property. The epoxy resin may be dyed depending on a product property.

Step 23 may include grinding a surface of the nonconductive film.

Figure 55:
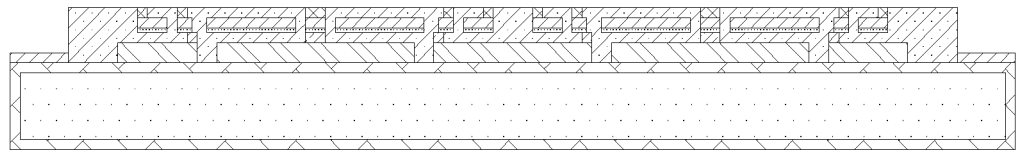

As illustrated in FIG. 55, the surface of the non-conductive adhesive film is ground after the applying the non-conductive adhesive film has been performed, in order to expose the fourth metal wiring layer, maintain a flatness of the nonconductive film and the fourth metal wiring layer, and control thickness of the nonconductive film.

Step 24 may include performing metallization pretreatment on the surface of the nonconductive film.

Figure 56:
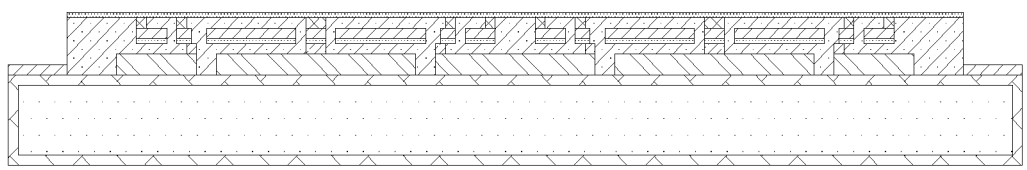

As illustrated in FIG. 56, the metallization pretreatment is performed on the surface of the nonconductive film to attach a layer of metalized polymer material, which serves as a catalytic converter to plate with a metal material subsequently. Attaching the metalized polymer material may include spraying, plasma oscillating, surface roughening, and drying.

Step 25 may include applying with a photoresist film.

Figure 57:
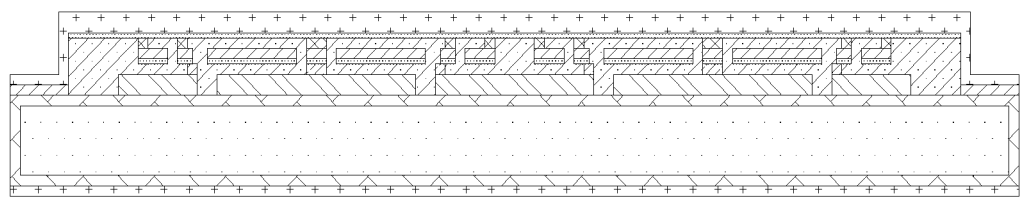

As illustrated in FIG. 57, the top surface and the bottom surface of the metal substrate in step 24 are applied with the photoresist film which can be exposed and developed, to protect a subsequent operation of plating with the fifth metal wiring layer. The photoresist film may be a dry photoresist film or a wet photoresist film.

Step 26 may include removing a part of the photoresist film on the top surface of the metal substrate.

Figure 58:
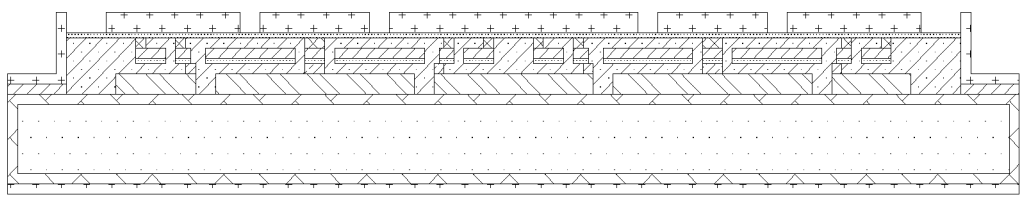

As illustrated in FIG. 58, the top surface of the metal substrate, which has been applied with the photoresist film in step 25, is exposed and developed with a pattern using an exposure and development equipment, and the part of the photoresist film in the pattern is removed, so as to expose a region of the top surface of the metal substrate to be etched later.

Step 27 may include etching.

Figure 59:
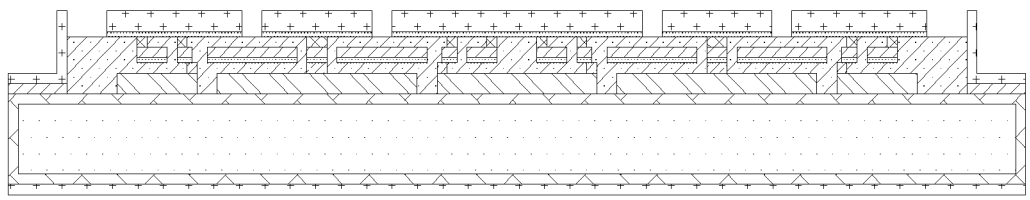

As illustrated in FIG. 59, the etching is performed in a region from which the part of the photoresist film has been removed in step 26, to completely erode metal regions except metal wirings required to be reserved. The etching may be performed with copper chloride, ferric chloride or any other chemical potion for etching.

Step 28 may include removing the photoresist film on the top surface of the metal substrate.

Figure 60:
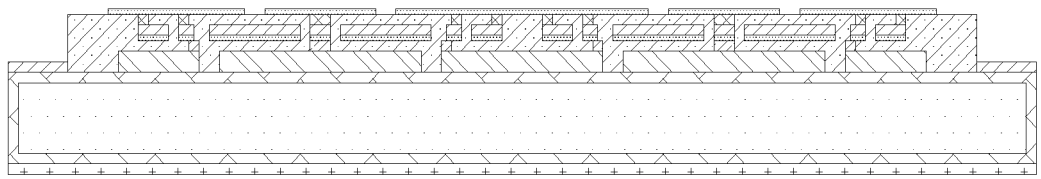

As illustrated in FIG. 60, the photoresist film on the top surface of the metal substrate is removed, to expose a pattern in a metal region required to be plated subsequently.

Step 29 may include plating with a fifth metal wiring layer.

Figure 61:
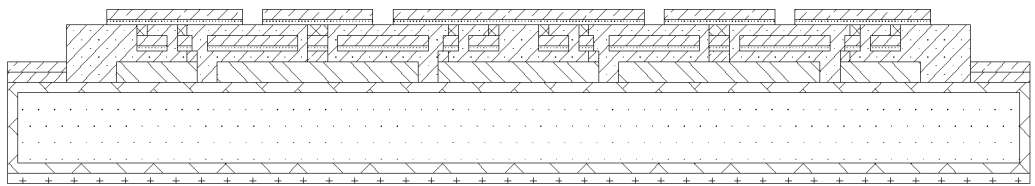

As illustrated in FIG. 61, the top surface of the metal substrate in step 28 is plated with the fifth metal wiring layer, so that a die pad and a lead are formed on the metal substrate. The fifth metal wiring layer may be made of copper, nickel-gold, nickel-palladium-gold, silver, gold or tin. The plating may be implemented through chemical deposition and electrolytic plating or through only entirely chemical deposition to obtain required thickness.

Step 30 may include applying with a photoresist film.

Figure 62:
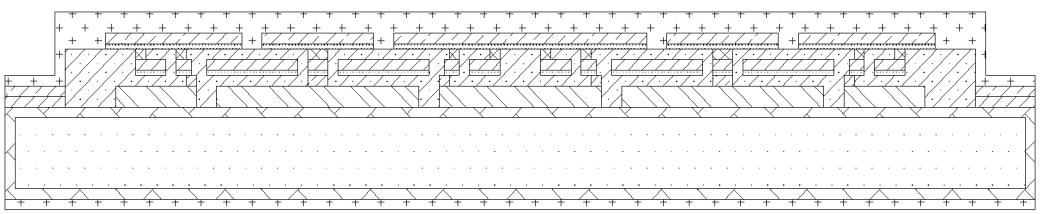

As illustrated in FIG. 62, the top surface of the metal substrate in step 29 is applied with the photoresist film which can be exposed and developed. The photoresist film may be a dry photoresist film or a wet photoresist film.

Step 31 may include removing a part of the photoresist film on the bottom surface of the metal substrate.

Figure 63:
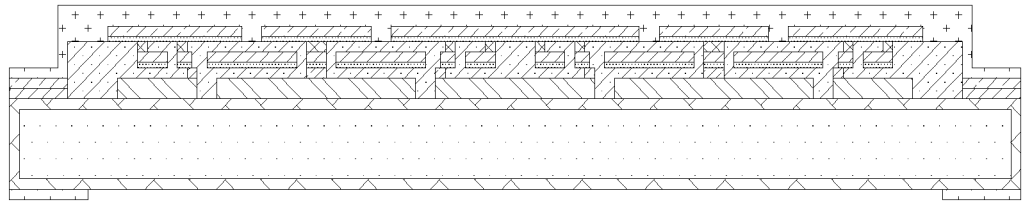

As illustrated in FIG. 63, the bottom surface of the metal substrate, which has been applied with the photoresist film in step 30, is exposed and developed with a pattern using an exposure and development equipment, and the part of the photoresist film in the pattern is removed, so as to expose a region of the bottom surface of the metal substrate to be etched later.

Step 32 may include performing chemical etching.

Figure 64:
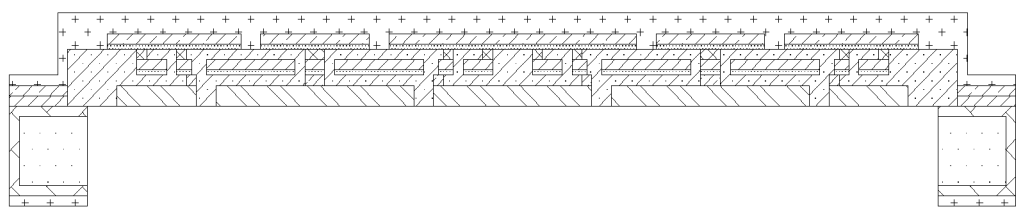

As illustrated in FIG. 64, the chemical etching is performed in a region on the bottom surface of the metal substrate in which exposing and developing have been performed in step 31, till the metal wiring layer is reached. A chemical potion for etching may be copper chloride, ferric chloride or any other chemical potion available for chemical etching.

Step 33 may include applying with a photoresist film.

Figure 65:
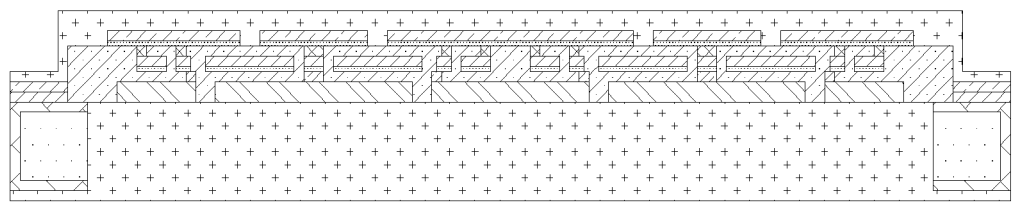

As illustrated in FIG. 65, the bottom surface of the metal substrate on which the chemical etching has been performed in step 32 is applied with the photoresist film which can be exposed and developed. The photoresist film may be a dry photoresist film or a wet photoresist film.

Step 34 may include removing a part of the photoresist film on the bottom surface of the metal substrate.

Figure 66:
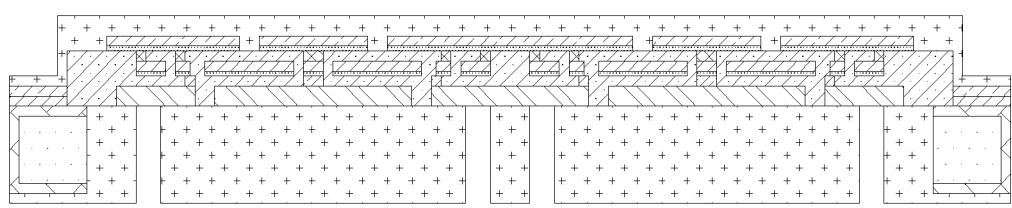

As illustrated in FIG. 66, the bottom surface of the metal substrate, which has been applied with the photoresist film in step 33, is exposed and developed with a pattern using an exposure and development equipment, and the part of the photoresist film in the pattern is removed, so as to expose a region of the bottom surface of the metal substrate to be plated later.

Step 35 may include plating with a metal pillar.

Figure 67:
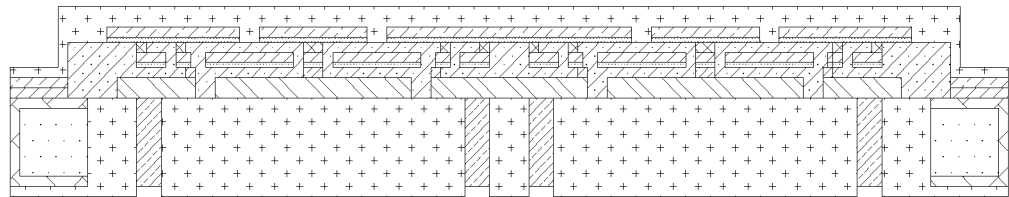

As illustrated in FIG. 67, the region of the bottom surface of the metal substrate from which the part of the photoresist film has been removed in step 34 is plated with the metal pillar. The metal pillar may be made of copper, aluminum, nickel, silver, gold, copper-silver, nickel-gold, nickel-palladium-gold and so on, and of course any other conductive metal material may be feasible, without limitation to a metal material such as copper, aluminum, nickel, silver, gold, copper-silver, nickel-gold, or nickel-palladium-gold. The plating may be implemented through chemical deposition or electrolytic plating Step 36 may include removing the photoresist film.

Figure 68:
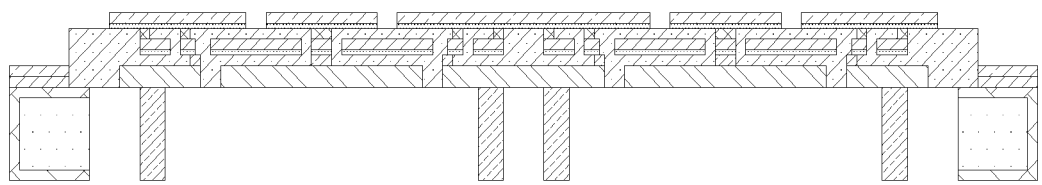

As illustrated in FIG. 68, the photoresist film on the surface of the metal substrate is removed. The photoresist film may be removed through softening with a chemical potion and then flushing with high-pressure water.

Step 37 may include coating with an adhesive material.

Figure 69:
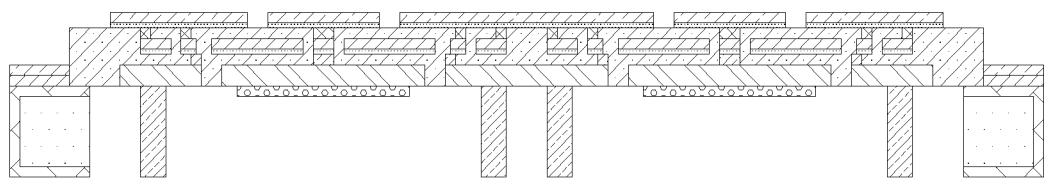

As illustrated in FIG. 69, a bottom surface of the die pad formed in step 29 is coated with a conductive or non-conductive adhesive material, for integration of the die pad and a chip to be embedded later.

Step 38 may include bonding dies.

Figure 70:
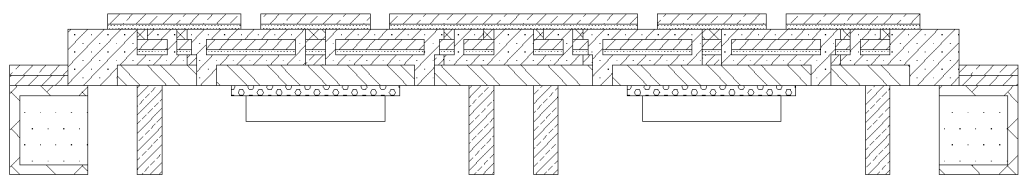

As illustrated in FIG. 70, a chip is bonded in the conductive or non-conductive adhesive material in step 37.

Step 39 may include bonding a metal wire.

Figure 71:
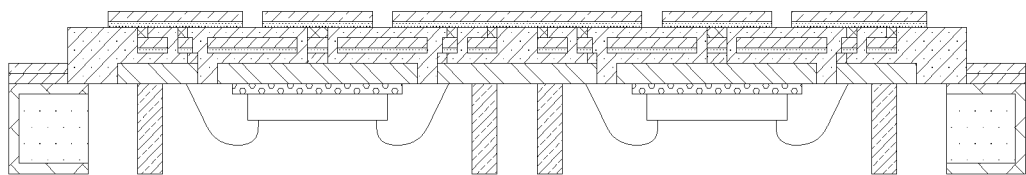

As illustrated in FIG. 71, the metal wire is bonded between a top surface of the chip and a top surface of the lead. The metal wire may be made of gold, silver, copper, aluminum or alloy, and a shape of the metal wire may be a filament or a strip.

Step 40 may include encapsulating.

Figure 72:
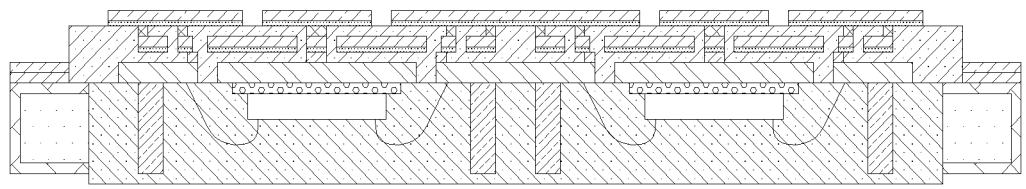

As illustrated in FIG. 72, encapsulating is performed on the bottom surface of the metal substrate in step 39 with a molding material. The encapsulating may be implemented through pouring glue with a mold, spraying with a spray device, pasting a film or brushing coating. The molding material may be an epoxy resin with or without a filler.

Step 41 may include grinding a surface of the epoxy resin.

Figure 73:
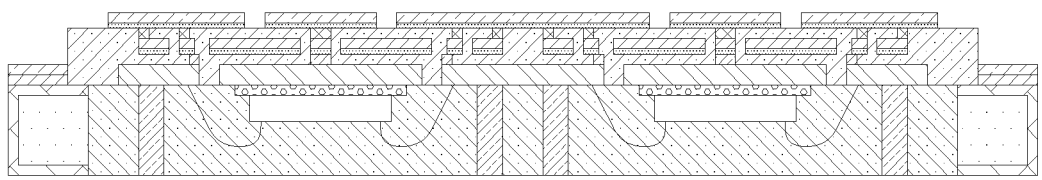

As illustrated in FIG. 73, the surface of the epoxy resin is grinded after the molding with the epoxy resin has been performed in step 40, in order to expose the metal pillar out of the surface of the encapsulation, and control thickness of the epoxy resin.

Step 42 may include plating with an anti-oxidizing metal layer or coating with an antioxidant OSP.

Figure 74:
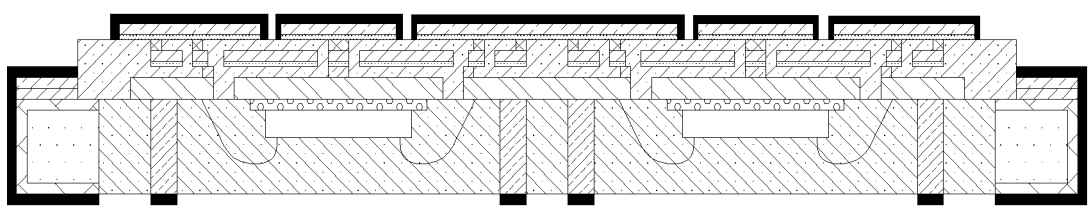

As illustrated in FIG. 74, an exposed surface of the metal substrate is plated with the anti-oxidizing metal layer such as gold, nickel-gold, nickel-palladium-gold or tin, or is coated with an antioxidant (OSP) after the surface of the epoxy resin has been ground in step 41.

What is claimed is:

1. A method for manufacturing a first-etched and later-packaged normal chip three-dimensional system-in-package metal wiring board, comprising:

step 1, providing a metal substrate;

step 2, pre-plating a surface of the metal substrate with a micro copper layer;

step 3, applying a photoresist film, wherein a top surface and a bottom surface of the metal substrate which have been pre-plated with the micro copper layer are respectively applied with the photoresist film which can be exposed and developed;

step 4, removing a part of the photoresist film on the bottom surface of the metal substrate, wherein the bottom surface of the metal substrate, which has been pasted with the photoresist film in step 3, is exposed and developed with a pattern using an exposure and development equipment, and the part of the photoresist film in the pattern is removed, so as to expose a region of the bottom surface of the metal substrate to be plated later;

step 5, plating with a metal wiring layer, wherein the region of the bottom surface of the metal substrate from which the part of the photoresist film has been removed in step 4 is plated with the metal wiring layer;

step 6, applying a photoresist film, wherein the bottom surface of the metal substrate in step 5 is applied with the photoresist film which can be exposed and developed;

step 7, removing a part of the photoresist film on the bottom surface of the metal substrate, wherein the bottom surface of the metal substrate, which has been pasted with the photoresist film in step 6, is exposed and developed with a pattern using an exposure and development equipment, and the part of the photoresist film in the pattern is removed, so as to expose a region of the bottom surface of the metal substrate to be plated later;

step 8, plating with a high-conductivity metal wiring layer,
wherein the region of the bottom surface of the metal substrate from which the part of the photoresist film has been removed in step 7 is plated with the high conductivity metal wiring layer;
step 9, removing the photoresist film,
wherein the photoresist film on the surface of the metal substrate is removed;
step 10, molding with an epoxy resin,
wherein the molding with the epoxy resin for protection is performed on a surface of the metal wiring layer on the bottom surface of the metal substrate;
step 11, grinding a surface of the epoxy resin,
wherein the surface of the epoxy resin is ground after the molding with the epoxy resin has been performed;
step 12, applying a photoresist film,
wherein the top surface and the bottom surface of the metal substrate are applied with the photoresist film which can be exposed and developed after the surface of the epoxy resin has been ground in step 11;
step 13, removing a part of the photoresist film on the top surface of the metal substrate,
wherein the top surface of the metal substrate, which has been applied with the photoresist film in step 12, is exposed and developed with a pattern using an exposure and development equipment, and the part of the photoresist film in the pattern is removed, so as to expose a region of the top surface of the metal substrate to be etched later;
step 14, chemical etching,
wherein the chemical etching is performed in the region of the top surface of the metal substrate in which exposing and developing have been performed in step 13;
step 15, plating with a metal layer,
wherein the top surface of the metal substrate on which the chemical etching has been performed in step 14 is plated with the metal layer, so that a die pad and a lead are formed on the metal substrate;
step 16, applying a photoresist film,
wherein the top surface and the bottom surface of the metal substrate are applied with the photoresist film which can be exposed and developed after the plating with the metal layer has been performed in step 15;
step 17, removing a part of the photoresist film on the top surface of the metal substrate,
wherein the top surface of the metal substrate, which has been applied with the photoresist film in step 16, is exposed and developed with a pattern using an exposure and development equipment, and the part of the photoresist film in the pattern is removed, so as to expose a region of the top surface of the metal substrate to be plated later;
step 18, plating with a metal pillar,
wherein the region of the top surface of the metal substrate from which the part of the photoresist film has been removed in step 17 is plated with the metal pillar;
step 19, removing the photoresist film,
wherein the photoresist film on the surface of the metal substrate is removed;
step 20, coating with an adhesive material,
wherein a top surface of the die pad is coated with a conductive or non-conductive adhesive material after the die pad has been formed in step 15;
step 21, bonding dies,
wherein a chip is bonded in the conductive or non-conductive adhesive material in step 20;
step 22, bonding a metal wire,
wherein the metal wire is bonded between a top surface of the chip and a top surface of the lead;
step 23, encapsulating,
wherein the molding with a molding material is performed on the top surface of the metal substrate in step 22;
step 24, grinding a surface of an epoxy resin,
wherein the surface of the epoxy resin is ground after the molding with the epoxy resin has been performed in step 23; and
step 25, plating with an anti-oxidizing metal layer or coating with an antioxidant,
wherein an exposed surface of the metal substrate is plated with the anti-oxidizing metal layer or is coated with the antioxidant after the surface of the epoxy resin has been ground in step 24.

2. The first-etched and later-packaged normal chip three-dimensional system-in-package metal wiring board structure manufactured by the method according to claim 1, comprising a metal substrate frame (1), wherein a die pad (2) and a lead (3) are provided in the metal substrate frame (1), a chip (5) is provided on a top surface or a bottom surface of the die pad (2) via a conductive or nonconductive material (4), the top surface of the chip (5) and the top surface of the lead (3) are connected through a metal wire (6), a conductive pillar (7) is provided on the top surface or the bottom surface of the lead (3), and a peripheral region of the die pad (2), a region between the die pad (2) and the lead (3), a region between the lead (3) and another lead (3), an upper region of the die pad (2) and the lead (3), a lower region of the die pad (2) and the lead (3), and the chip (5), the metal wire (6) and the conductive pillar (7) are encapsulated, with a molding material (8) being flush with a top of the conductive pillar (7), and surfaces of the metal substrate frame (1), the lead (3) and the conductive pillar (7) exposed from the molding material (8) being plated with an anti-oxidizing layer or being coated with an antioxidant (9).

3. The first-etched and later-packaged normal chip three-dimensional system-in-package metal wiring board structure manufactured by the method according to claim 1, comprising a metal substrate frame (1) and a chip (5), wherein a lead (3) is provided in the metal substrate frame (1), the chip (5) is provided on a top surface of the lead (3) or between the lead (3) and another lead (3) via a conductive or nonconductive adhesive material (4), a top surface of the chip (5) and the top surface of the lead (3) are connected through a metal wire (6), and a conductive pillar (7) is provided on the top surface or a bottom surface of the lead (3), a region between the lead (3) and another lead (3), an upper region of the lead (3), an lower region of the lead (3), and a peripheral region of the chip (5), the metal wire (6) and the conductive pillar (7) are encapsulated, with a molding material (8) being flush with a top of the conductive pillar (7), and surfaces of the metal substrate frame (1), the lead (3) and the conductive pillar (7) exposed from the molding material (8) being plated with an anti-oxidizing layer or being coated with an antioxidant (9).

4. The first-etched and later-packaged normal chip three-dimensional system-in-package metal wiring board structure according to claim 3, wherein a passive device (10) is connected across the lead (3) and another lead (3) via a conductive adhesive material, the passive device (10) is connected across the top surface of the lead (3) and the top surface of another lead (3), or across the bottom surface of the lead (3) and the bottom surface of another lead (3).

5. The first-etched and later-packaged normal chip three-dimensional system-in-package metal wiring board structure according to claim 2, wherein there are a plurality of rings of the conductive pillars (7).

6. The first-etched and later-packaged normal chip three-dimensional system-in-package metal wiring board structure according to claim 2, wherein a passive device (10) is connected across the lead (3) and another lead (3) via a conductive adhesive material, wherein the passive device (10) is connected across the top surface of the lead (3) and the top surface of another lead (3), or across the bottom surface of the lead (3) and the bottom surface of another lead (3).

7. The first-etched and later-packaged normal chip three-dimensional system-in-package metal wiring board structure according to claim 2, wherein an electrostatic discharge coil (11) is provided between the die pad (1) and the lead (2), wherein the top surface of the chip (6) and the top surface of the electrostatic discharge coil (11) are connected through a metal wire (6).

8. The first-etched and later-packaged normal chip three-dimensional system-in-package metal wiring board structure according to claim 6, wherein there are a plurality of rings of the conductive pillars (7).

9. The first-etched and later-packaged normal chip three-dimensional system-in-package metal wiring board structure according to claim 2, wherein there are a plurality of die pads (2), the chip (5) is provided on each of the plurality of die pads (2) via a conductive or nonconductive adhesive material (4), and the top surface of the chip (5) and the top surface of another chip (5) are connected through a metal wire (6).

10. The first-etched and later-packaged normal chip three-dimensional system-in-package metal wiring board structure according to claim 2, wherein a second chip (12) is provided on the top surface of the chip (5) via a conductive or nonconductive adhesive material (4), and the top surface of the second chip (12) and the lead (3) are connected through a metal wire (6).

11. The first-etched and later-packaged normal chip three-dimensional system-in-package metal wiring board structure according to claim 2, wherein a second conductive pillar (13) is provided on the top surface or the bottom surface of the lead (3), a second chip (12) is flipped on the second conductive pillar (13) via a conductive material (14), and the second conductive pillar (13) and the second chip (12) are provided inside the molding material (8).

12. The method for manufacturing an first-etched and later-packaged normal chip three-dimensional system-in-package metal wiring board according to claim 1, wherein step 15 is performed between step 4 and step 5.

13. A method for manufacturing an first-etched and later-packaged normal chip three-dimensional system-in-package metal wiring board, comprising:
step 1, providing a metal substrate;
step 2, pre-plating a surface of the metal substrate with a micro copper layer;
step 3, applying with a photoresist film,
wherein a top surface and a bottom surface of the metal substrate which have been pre-plated with the micro copper layer are respectively applied with the photoresist film which can be exposed and developed;
step 4, removing a part of the photoresist film on the top surface of the metal substrate,
wherein the top surface of the metal substrate, which has been applied with the photoresist film in step 3, is exposed and developed with a pattern using an exposure and development equipment, and the part of the photoresist film in the pattern is removed, so as to expose a region of the top surface of the metal substrate to be plated later;
step 5, plating with a first metal wiring layer,
wherein the region of the top surface of the metal substrate from which the part of the photoresist film has been removed in step 4 is plated with the first metal wiring layer;
step 6, applying with a photoresist film,
wherein the top surface of the metal substrate in step 5 is applied with the photoresist film which can be exposed and developed;
step 7, removing a part of the photoresist film on the top surface of the metal substrate,
wherein the top surface of the metal substrate, which has been applied with the photoresist film in step 6, is exposed and developed with a pattern using an exposure and development equipment, and the part of the photoresist film in the pattern is removed, so as to expose a region of the top surface of the metal substrate to be plated later;
step 8, plating with a second metal wiring layer,
wherein the region of the top surface of the metal substrate from which the part of the photoresist film has been removed in step 7 is plated with the second metal wiring layer, which serves as a conductive pillar to connect the first metal wiring layer to a third metal wiring layer;
step 9, removing the photoresist film,
wherein the photoresist film on the surface of the metal substrate is removed;
step 10, applying with a non-conductive adhesive film,
wherein the top surface of the metal substrate is applied with a layer of the non-conductive adhesive film;
step 11, grinding a surface of the non-conductive adhesive film,
wherein the surface of the non-conductive adhesive film is ground after the applying the non-conductive adhesive film has been performed;
step 12, performing metallization pretreatment on the surface of the non-conductive adhesive film,
wherein the metallization pretreatment is performed on the surface of the non-conductive adhesive film;
step13, applying with a photoresist film,
wherein the top surface and the bottom surface of the metal substrate in step 12 are applied with the photoresist film which can be exposed and developed;
step 14, removing a part of the photoresist film on the top surface of the metal substrate,
wherein the top surface of the metal substrate, which has been applied with the photoresist film in step 13, is exposed and developed with a pattern using an exposure and development equipment, and the part of the photoresist film in the pattern is removed, so as to expose a region of the top surface of the metal substrate to be etched later;
step 15, etching;
wherein the etching is performed in a region from which the part of the photoresist film has been removed in step 14;

step 16, removing the photoresist film on the top surface of the metal substrate,
wherein the photoresist film on the top surface of the metal substrate is removed, so as to expose a metallized region to be plated later;
step 17, plating with a third metal wiring layer,
wherein the top surface of the metal substrate in step 16 is plated with the third metal wiring layer;
step 18, applying with a photoresist film,
wherein the top surface of the metal substrate in step 17 is applied with the photoresist film which can be exposed and developed;
step 19, removing a part of the photoresist film on the top surface of the metal substrate,
wherein the top surface of the metal substrate, which has been applied with the photoresist film in step 18, is exposed and developed with a pattern using an exposure and development equipment, and the part of the photoresist film in the pattern is removed, so as to expose a region of the top surface of the metal substrate to be plated later;
step 20, plating with a fourth metal wiring layer,
wherein the region of the top surface of the metal substrate from which the part of the photoresist film has been removed in step 19 is plated with the fourth metal wiring layer, which serves as a conductive pillar to connect the third metal wiring layer to a fifth metal wiring layer;
step 21, removing the photoresist film,
wherein the photoresist film on the surface of the metal substrate is removed;
step 22, applying with a non-conductive adhesive film,
wherein the top surface of the metal substrate is applied with a layer of the non-conductive adhesive film;
step 23, grinding a surface of the non-conductive adhesive film,
wherein the surface of the non-conductive adhesive film is ground after the applying the non-conductive adhesive film has been performed;
step 24, performing metallization pretreatment on the surface of the non-conductive adhesive film,
wherein the metallization pretreatment is performed on the surface of the non-conductive adhesive film;
step 25, applying with a photoresist film,
wherein the top surface and the bottom surface of the metal substrate in step 24 are applied with the photoresist film which can be exposed and developed;
step 26, removing a part of the photoresist film on the bottom surface of the metal substrate,
wherein the top surface of the metal substrate, which has been applied with the photoresist film in step 25, is exposed and developed with a pattern using an exposure and development equipment, and the part of the photoresist film in the pattern is removed, so as to expose a region of the top surface of the metal substrate to be etched later;
step 27, etching;
wherein the etching is performed in a region from which the part of the photoresist film has been removed in step 26;
step 28, removing the photoresist film on the top surface of the metal substrate,
wherein the photoresist film on the top surface of the metal substrate is removed;
step 29, plating with a fifth metal wiring layer,
wherein the top surface of the metal substrate in step 28 is plated with the fifth metal wiring layer, so that a die pad and a lead are formed on the metal substrate;
step 30, applying with a photoresist film,
wherein the top surface of the metal substrate in step 29 is applied with the photoresist film which can be exposed and developed;
step 31, removing a part of the photoresist film on the bottom surface of the metal substrate,
wherein the bottom surface of the metal substrate, which has been applied with the photoresist film in step 30, is exposed and developed with a pattern using an exposure and development equipment, and the part of the photoresist film in the pattern is removed, so as to expose a region of the bottom surface of the metal substrate to be etched later;
step 32, chemical etching;
wherein the chemical etching is performed in a region on the bottom surface of the metal substrate in which exposing and developing have been performed in step 31, till the metal wiring layer is reached;
step 33, applying with a photoresist film,
wherein the bottom surface of the metal substrate on which the chemical etching has been performed in step 32 is applied with the photoresist film which can be exposed and developed;
step 34, removing a part of the photoresist film on the bottom surface of the metal substrate,
wherein the bottom surface of the metal substrate, which has been applied with the photoresist film in step 33, is exposed and developed with a pattern using an exposure and development equipment, and the part of the photoresist film in the pattern is removed, so as to expose a region of the bottom surface of the metal substrate to be plated later;
step 35, plating with a metal pillar,
wherein the region of the bottom surface of the metal substrate from which the part of the photoresist film has been removed in step 34 is plated with the metal pillar;
step 36, removing the photoresist film,
wherein the photoresist film on the surface of the metal substrate is removed;
step 37, coating with an adhesive material;
wherein a bottom surface of the die pad is coated with a conductive or non-conductive adhesive material after the photoresist film on the surface of the metal substrate has been removed in step 36;
step 38, bonding dies,
wherein a chip is bonded in the conductive or non-conductive adhesive material in step 37;
step 39, bonding a metal wire,
wherein the metal wire is bonded between a top surface of the chip and a top surface of the lead;
step 40, encapsulating,
wherein the molding with epoxy resin, which is commonly known as a molding material, is performed on the bottom surface of the metal substrate in step 39;
step 41, grinding a surface of the epoxy resin,
wherein the surface of the epoxy resin is ground after the molding with the epoxy resin has been performed in step 40;
step 42, plating with an anti-oxidizing metal layer or coating with an antioxidant,
wherein an exposed surface of the metal substrate is plated with the anti-oxidizing metal layer or is coated with the antioxidant after the surface of the epoxy resin has been ground in step 41.

14. The method for manufacturing a first-etched and later-packaged normal chip three-dimensional system-in-package metal wiring board according to claim 13, wherein steps 6 to 17 are repeated for times to form more metal wiring layers.

15. The first-etched and later-packaged normal chip three-dimensional system-in-package metal wiring board structure according to claim 3, wherein there are a plurality of rings of the conductive pillars (7).

16. The first-etched and later-packaged normal chip three-dimensional system-in-package metal wiring board structure according to claim 6, wherein an electrostatic discharge coil (11) is provided between the die pad (1) and the lead (2), wherein the top surface of the chip (6) and the top surface of the electrostatic discharge coil (11) are connected through a metal wire (6).

17. The first-etched and later-packaged normal chip three-dimensional system-in-package metal wiring board structure according to claim 6, wherein there are a plurality of die pads (2), the chip (5) is provided on each of the plurality of die pads (2) via a conductive or nonconductive adhesive material (4), and the top surface of the chip (5) and the top surface of another chip (5) are connected through a metal wire (6).

18. The first-etched and later-packaged normal chip three-dimensional system-in-package metal wiring board structure according to claim 6, wherein a second chip (12) is provided on the top surface of the chip (5) via a conductive or nonconductive adhesive material (4), and the top surface of the second chip (12) and the lead (3) are connected through a metal wire (6).

19. The first-etched and later-packaged normal chip three-dimensional system-in-package metal wiring board structure according to claim 6, wherein a second conductive pillar (13) is provided on the top surface or the bottom surface of the lead (3), a second chip (12) is flipped on the second conductive pillar (13) via a conductive material (14), and the second conductive pillar (13) and the second chip (12) are provided inside the molding material (8).

* * * * *